United States Patent
Siew

(10) Patent No.: US 9,997,402 B2
(45) Date of Patent: Jun. 12, 2018

(54) METHOD OF MANUFACTURING A WIRING STRUCTURE ON A SELF-FORMING BARRIER PATTERN

(71) Applicant: Samsung Electronics Co., Ltd., Suwon-si, Gyeonggi-do (KR)

(72) Inventor: Yong-Kong Siew, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days. days.

(21) Appl. No.: 15/292,756

(22) Filed: Oct. 13, 2016

(65) Prior Publication Data
US 2017/0278746 A1    Sep. 28, 2017

(30) Foreign Application Priority Data
Mar. 23, 2016 (KR) .................. 10-2016-0034585

(51) Int. Cl.
| | |
|---|---|
| *H01L 21/768* | (2006.01) |
| *H01L 23/522* | (2006.01) |
| *H01L 23/532* | (2006.01) |
| *H01L 21/288* | (2006.01) |

(52) U.S. Cl.
CPC .... *H01L 21/76823* (2013.01); *H01L 21/7681* (2013.01); *H01L 21/76808* (2013.01); *H01L 21/76831* (2013.01); *H01L 21/76835* (2013.01); *H01L 21/76846* (2013.01); *H01L 21/76849* (2013.01); *H01L 21/76877* (2013.01); *H01L 21/76885* (2013.01); *H01L 23/5226* (2013.01); *H01L 23/53209* (2013.01); *H01L 23/53223* (2013.01); *H01L 23/53238* (2013.01); *H01L 23/53252* (2013.01); *H01L 21/288* (2013.01);
(Continued)

(58) Field of Classification Search
CPC ......... H01L 21/76823; H01L 21/76849; H01L 21/76831; H01L 21/76877; H01L 21/76846; H01L 21/7681
See application file for complete search history.

(56) References Cited

U.S. PATENT DOCUMENTS

| | | | | |
|---|---|---|---|---|
| 5,530,293 | A | * | 6/1996 | Cohen ............... H01L 21/76224 257/642 |
| 6,413,852 | B1 | | 7/2002 | Grill et al. |

(Continued)

*Primary Examiner* — Kyoung Lee
*Assistant Examiner* — Christina Sylvia
(74) *Attorney, Agent, or Firm* — Harness, Dickey & Pierce, P.L.C.

(57) ABSTRACT

In a method of manufacturing a semiconductor device, a first insulating interlayer and a sacrificial layer is sequentially formed on a substrate. The sacrificial layer is partially removed to form a first opening exposing an upper surface of the first insulating interlayer. An insulating liner including silicon oxide is conformally formed on the exposed upper surface of the first insulating interlayer and a sidewall of the first opening. At least a portion of the insulating liner on the upper surface of the first insulating interlayer and a portion of the first insulating interlayer thereunder are removed to form a second opening connected to the first opening. A self-forming barrier (SFB) pattern is formed on a sidewall of the second opening and the insulating liner. A wiring structure is formed to fill the first and second openings. After the sacrificial layer is removed, a second insulating interlayer is formed.

20 Claims, 42 Drawing Sheets

(52) U.S. Cl.
CPC .. *H01L 21/76879* (2013.01); *H01L 21/76897* (2013.01)

(56) References Cited

U.S. PATENT DOCUMENTS

| | | | |
|---|---|---|---|
| 6,958,540 B2 * | 10/2005 | Gambino | H01L 21/76807 257/750 |
| 8,461,683 B2 | 6/2013 | Yoo et al. | |
| 8,652,962 B2 | 2/2014 | Singh et al. | |
| 8,951,911 B2 | 2/2015 | Naik et al. | |
| 2008/0003866 A1 * | 1/2008 | Bae | H01L 21/76805 439/417 |
| 2011/0049718 A1 * | 3/2011 | Matsumoto | C23C 16/40 257/751 |
| 2011/0183515 A1 | 7/2011 | Kudo et al. | |
| 2012/0122284 A1 * | 5/2012 | Kim | H01L 21/82342 438/287 |
| 2014/0161992 A1 | 6/2014 | Ishizaka et al. | |
| 2014/0299988 A1 * | 10/2014 | Cabral, Jr. | H01L 21/76846 257/751 |
| 2015/0004784 A1 | 1/2015 | Yokoyama et al. | |
| 2015/0200109 A1 * | 7/2015 | Kong | H01L 21/31144 438/703 |
| 2015/0262872 A1 | 9/2015 | Ishizaka et al. | |

\* cited by examiner

METHOD OF MANUFACTURING A WIRING STRUCTURE ON A SELF-FORMING BARRIER PATTERN

CROSS-REFERENCE TO RELATED APPLICATION

This application claims priority under 35 USC § 119 to Korean Patent Application No. 10-2016-0034585, filed on Mar. 23, 2016 in the Korean Intellectual Property Office (KIPO), the contents of which are herein incorporated by reference in their entirety.

BACKGROUND

1. Field

Example embodiments relate to methods of manufacturing a semiconductor device. More particularly, example embodiments relate to methods of manufacturing a semiconductor device including wiring structures.

2. Description of the Related Art

Wirings of a semiconductor device may be formed by a damascene process in an insulating interlayer, and the insulating interlayer may include a low-k dielectric material so as to decrease the parasitic capacitance between the wirings. The insulating interlayer including the low-k dielectric material may be damaged when an etching process for forming a trench and/or a via hole so that the dielectric constant of the insulating interlayer may increase. Accordingly, the parasitic capacitance between wirings filling the trench and/or the via hole may increase.

SUMMARY

Example embodiments provide a method of manufacturing a semiconductor device having improved characteristics.

According to example embodiments, there is provided a method of manufacturing a semiconductor device. In the method, a first insulating interlayer and a sacrificial layer may be sequentially formed on a substrate. The sacrificial layer may be partially removed to form a first opening exposing an upper surface of the first insulating interlayer. An insulating liner including silicon oxide may be conformally formed on the exposed upper surface of the first insulating interlayer and a sidewall of the first opening. At least a portion of the insulating liner on the upper surface of the first insulating interlayer and a portion of the first insulating interlayer thereunder may be removed to form a second opening connected to the first opening. A self-forming barrier (SFB) pattern may be formed on a sidewall of the second opening and the insulating liner. A wiring structure may be formed to fill the first and second openings. After the sacrificial layer is removed, a second insulating interlayer may be formed.

According to example embodiments, there is provided a method of manufacturing a semiconductor device. In the method, a first dielectric layer and a sacrificial layer may be sequentially formed on a substrate. The first dielectric layer may include silicon oxide, and the sacrificial layer may include amorphous carbon. The sacrificial layer may be partially removed to form a trench exposing an upper surface of the first dielectric layer. An insulating liner including silicon may be conformally formed on a sidewall of the trench. The first dielectric layer may be partially removed to form a via hole under the trench. A self-forming barrier (SFB) pattern including a metal silicon oxide may be formed on a sidewall of the via hole and the insulating liner. A wiring structure may be formed on the SFB pattern to fill the via hole and the trench. The sacrificial layer may be replaced with a second dielectric layer.

According to example embodiments, a method includes sequentially forming a first dielectric layer and a sacrificial layer on a substrate, the sacrificial layer not including silicon oxide, partially removing the sacrificial layer to form a trench exposing the first dielectric layer, conformally forming a silicon oxide layer on a sidewall of the trench, removing at least a portion of the silicon oxide layer to form a via hole connected to the trench, forming a metal layer on a sidewall of the via hole and the silicon oxide layer, reacting the metal layer with the exposed first dielectric layer and the silicon oxide layer to form a metal silicon oxide pattern, and forming a wiring structure on the metal silicon oxide pattern.

According to example embodiments, the semiconductor device may include the SFB pattern, which may be formed on the sidewall of the wiring, having a relatively thin thickness equal to or less than about several nanometers. Thus, the conductive structure including the SFB pattern may have relatively low resistance. The insulating interlayer containing the wiring may have a relatively low dielectric constant, and may not have etching damage. Thus, the parasitic capacitance between the wirings may be reduced.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor device in accordance with example embodiments;

FIGS. 24 to 56 are plan views and cross-sectional views illustrating stages of a method of manufacturing a semiconductor device in accordance with example embodiments.

DETAILED DESCRIPTION

Figure 1:
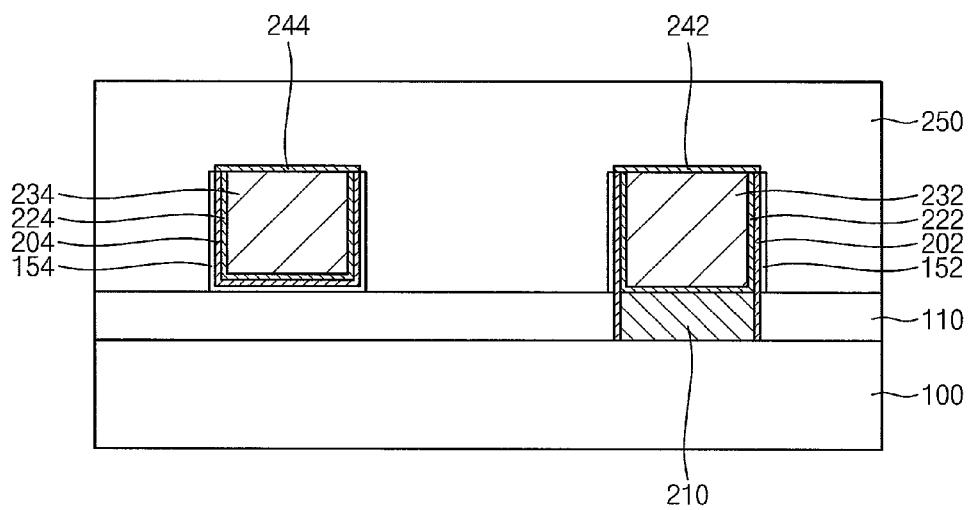
FIGS. 1 to 56 represent non-limiting, example embodiments as described herein.

FIG. 1 is a cross-sectional view illustrating a semiconductor device in accordance with example embodiments.

Referring to FIG. 1, the semiconductor device may include first and second wirings 232 and 234, a via 210, first and second self-forming barrier (SFB) patterns 202 and 204, and first and second insulating liners 152 and 154. The semiconductor device may further include first and second conductive liners 222 and 224, first and second capping patterns 242 and 244, and first and second insulating interlayers 110 and 250.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may be a silicon-on-insulator (SOI) substrate, or a germanium-on-insulator (GOI) substrate.

Various types of elements (not shown), e.g., gate structures, source/drain layers, contact plugs, wirings, etc. may be further formed on the substrate 100.

The first insulating interlayer 110 may include a low-k dielectric material containing silicon oxide but having a dielectric constant lower than that of silicon dioxide ($SiO_2$). For example, the first insulating interlayer 110 may include silicon oxide doped with carbon (SiCOH), silicon oxide doped with fluorine (F—$SiO_2$), a porous silicon oxide, etc.

The via 210 may extend through the first insulating interlayer 110, and may contact an underlying contact plug (not shown) or a wiring (not shown). FIG. 1 shows one via 210, however, the inventive concepts may not be limited thereto, and a plurality of vias 210 may be also formed.

The via 210 may include a metal, e.g., cobalt, ruthenium, etc.

The second insulating interlayer 250 may be formed on the first insulating interlayer 110. The second insulating interlayer 250 may include a low-k dielectric material containing silicon oxide but having a dielectric constant lower than that of silicon dioxide ($SiO_2$). For example, the second insulating interlayer 250 may include silicon oxide doped with carbon (SiCOH), silicon oxide doped with fluorine (F—$SiO_2$), a porous silicon oxide, etc. In some example embodiments, the second insulating interlayer 250 may include a material substantially the same as that of the first insulating interlayer 110 so as to be merged thereto, or the second insulating interlayer 250 may include a material different from that of the first insulating interlayer 110 so as to be distinguished therefrom.

The first and second wirings 232 and 234 may be formed in the second insulating interlayer 250. The first wiring 232 may be formed on the via 210. Each of the first and second wirings 232 and 234 may include a metal, e.g., copper, aluminum, etc.

In example embodiments, each of the first and second wirings 232 and 234 may extend in a direction substantially parallel to an upper surface of the substrate 100. Alternatively, each of the first and second wirings 232 and 234 may include two portions connected with each other, e.g., first and second extension portions each of which may extend in first and second directions, respectively, substantially parallel to the upper surface of the substrate 100 and substantially perpendicular to each other. FIG. 1 shows two wirings 232 and 234, however, the inventive concepts may not be limited thereto, and a single wiring or a plurality of wirings may be formed.

The first and second conductive liners 222 and 224 may cover lower surfaces and sidewalls of the first and second wirings 232 and 234, respectively, and may enhance the adhesion between the first and second wirings 232 and 234 and the respective first and second SFB patterns 202 and 204. In example embodiments, each of the first and second conductive liners 222 and 224 may have a constant thickness. Each of the first and second conductive liners 222 and 224 may include a metal, e.g., cobalt, ruthenium, etc.

The first conductive liner 222 may be formed between an upper surface of the via 210 and the lower surface of the first wiring 232, and may contact the upper surface of the via 210 and the lower surface of the first wiring 232. In example embodiments, the first conductive liner 222 may include a material substantially the same as that of the via 210, and thus may be merged thereto.

The via 210, the first conductive liner 222 and the first wiring 232 sequentially stacked may form a first wiring structure.

The first SFB pattern 202 may cover a sidewall of the first wiring structure, and the second SFB pattern 204 may cover the second conductive liner 224.

Each of the first and second SFB patterns 202 and 204 may include a metal silicon oxide, e.g., manganese silicon oxide, aluminum silicon oxide, vanadium silicon oxide, chrome silicon oxide, etc.

Each of the first and second SFB patterns 202 and 204 may have a thickness equal to or less than about several nanometers. Thus, a first conductive structure including the first wiring structure and the first SFB pattern 202, or a second conductive structure including the second wiring 234, the second conductive liner 224 and the second SFB pattern 204 may have a low resistance.

Each of the first and second insulating liners 152 and 154 may include, e.g., silicon oxide, and may have a thin thickness equal to or less than about several nanometers. The first insulating liner 152 may be formed on a portion of the first SFB pattern 202 on the sidewall of the first wiring 232, and the second insulating liner 154 may cover the second SFB pattern 204.

The first and second capping patterns 242 and 244 may be formed on the first and second wirings 232 and 234, respectively. Particularly, the first capping pattern 242 may be formed on the first wiring 232, the first conductive liner 222 and the first SFB pattern 202, and the second capping pattern 244 may be formed on the second wiring 234, the second conductive liner 224 and the second SFB pattern 204.

The first and second capping patterns 242 and 244 may include a metal, e.g., cobalt, ruthenium, etc., and may prevent or reduce metal included in the respective first and second wirings 232 and 234 from migrating into the second insulating interlayer 250.

FIG. 1 shows that the second insulating interlayer 250 surround sidewalls of the first and second wirings 232 and 234, and may be further formed on the first and second wirings 232 and 234, however, the inventive concepts may not be limited thereto. In some example embodiments, an upper portion of the second insulating interlayer 250 may be removed so that an upper surface of the second insulating interlayer 250 may be substantially coplanar with upper surfaces of the first and second capping patterns 242 and 244.

In the semiconductor device, the first and second SFB patterns 202 and 204 on sidewalls of the respective first and second wirings 232 and 234 may have thin thicknesses equal to or less than about several nanometers, and thus the first and second conductive structures including the first and second SFB patterns 202 and 204, respectively, may have a low resistance. The second insulating interlayer 250 containing the first and second wirings 232 and 234 may have a low dielectric constant, and may not have etching damage as will be illustrated later with respective to FIGS. 2 to 13. Thus, the parasitic capacitance between the first and second wirings 232 and 234 may be decreased.

FIGS. 2 to 13 are cross-sectional views illustrating stages of a method of manufacturing a semiconductor device in accordance with example embodiments.

Figure 2:
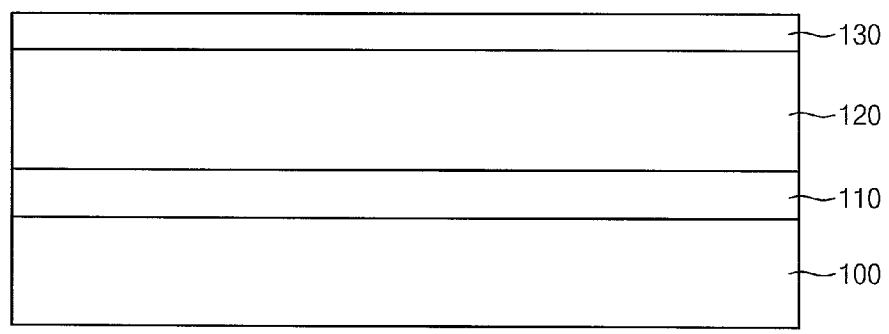
FIGS. 2 to 13 are cross-sectional views illustrating stages of a method of manufacturing a semiconductor device in accordance with example embodiments.

Referring to FIG. 2, a first insulating interlayer 110, a sacrificial layer 120 and a first mask layer 130 may be sequentially formed on a substrate 100.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may be an SOI substrate, or a GOI substrate.

Various types of elements (not shown), e.g., gate structures, source/drain layers, contact plugs, wirings, etc. may be further formed on the substrate 100.

The first insulating interlayer 110 may be formed of a low-k dielectric material containing silicon oxide but having a dielectric constant lower than that of silicon dioxide ($SiO_2$). For example, the first insulating interlayer 110 may be formed of silicon oxide doped with carbon (SiCOH), silicon oxide doped with fluorine (F—$SiO_2$), a porous silicon oxide, etc.

The sacrificial layer 120 may be formed of amorphous carbon. For example, the sacrificial layer 120 may include amorphous carbon layer (ACL), advanced patterning film (APF), carbon-based spin-on-hardmask (C-SOH), etc.

The first mask layer 130 may be formed of a nitride, e.g., silicon nitride, metal nitride, etc.

Figure 3:
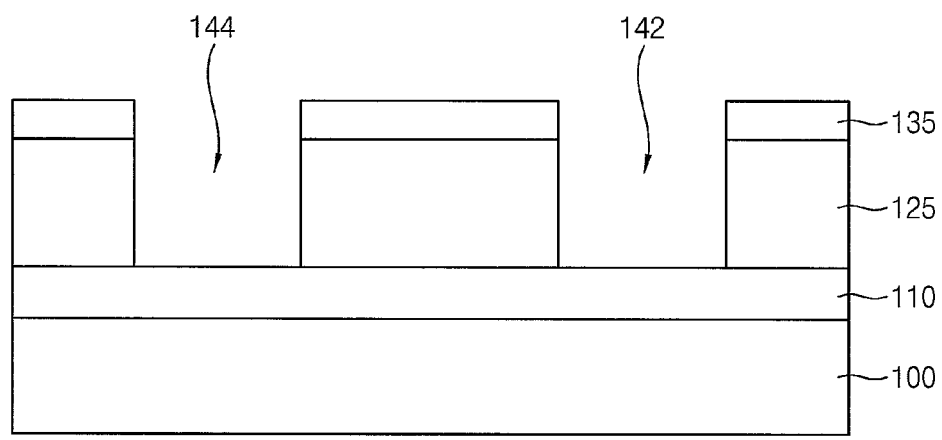

Referring to FIG. 3, the first mask layer 130 may be etched by an etching process using a first photoresist pattern (not shown) to form a first mask 135, and the sacrificial layer 120 may be etched using the first mask 135 as an etching mask to form a sacrificial pattern 125.

Thus, first and second trenches 142 and 144 each exposing an upper surface of the first insulating interlayer 110 may be formed in the sacrificial pattern 125. In example embodiments, each of the first and second trenches 142 and 144 may be formed to extend in a direction substantially parallel to an upper surface of the substrate 100. Alternatively, each of the first and second trenches 142 and 144 may be formed to include two connected areas, e.g., a first area extending in a first direction substantially parallel to the upper surface of the substrate 100 and a second area extending in a second direction substantially parallel to the upper surface of the substrate 100 and substantially perpendicular to the first direction.

However, the number of the trench in the sacrificial pattern 125 may not be limited thereto, and a single trench or more than two trenches may be formed.

Figure 4:
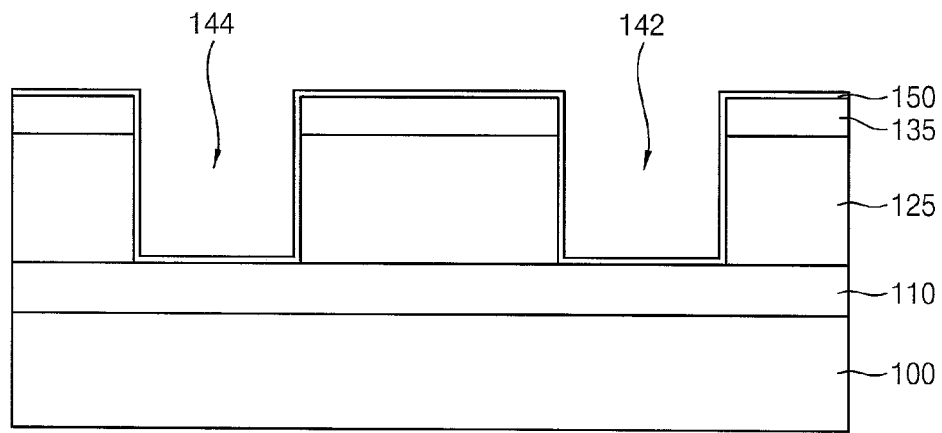

Referring to FIG. 4, an insulating liner layer 150 may be formed on the exposed upper surface of the first insulating interlayer 110, sidewalls of the first and second trenches 142 and 144, and the first mask 135.

In example embodiments, the insulating liner layer 150 may be formed of silicon oxide, and may be formed by a chemical vapor deposition (CVD) process or an atomic layer deposition (ALD) process.

In example embodiments, the insulating liner layer 150 may be conformally formed to have a thin thickness equal to or less than about several nanometers.

Figure 5:
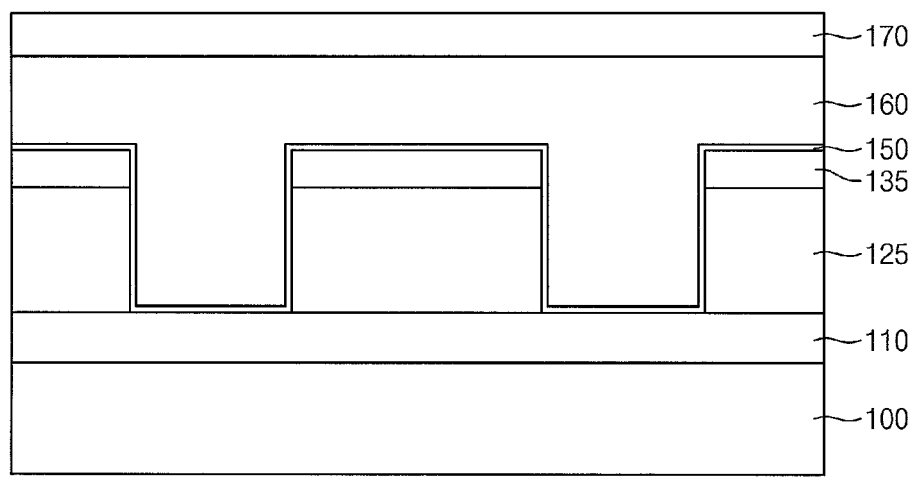

Referring to FIG. 5, a filling layer 160 may be formed on the insulating liner layer 150 to fill the first and second trenches 142 and 144, and a second mask layer 170 may be formed on the filling layer 160.

The filling layer 160 may be formed of a material that may be easily removed layer, e.g., silicon-based SOH or carbon-based SOH, and the second mask layer 170 may be formed of a nitride, e.g., silicon nitride, metal nitride, etc.

Figure 6:
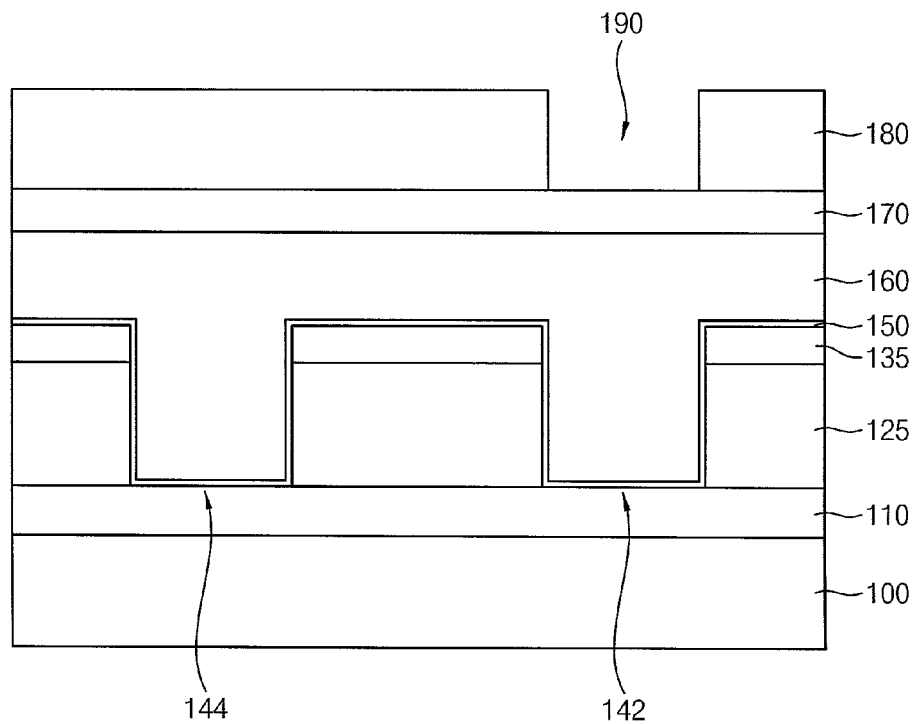

Referring to FIG. 6, a second photoresist pattern 180 having an opening 190 may be formed on the second mask layer 170.

In example embodiments, the opening 190 may vertically overlap at least one of the first and second trenches 142 and 144, and FIG. 6 shows that the opening 190 vertically overlaps the first trench 142.

In example embodiments, the opening 190 may vertically overlap at least a portion of the first trench 142, and in some cases, may also overlap a portion of the sacrificial pattern 125 adjacent the first trench 142.

However, the number of the opening 190 in the second photoresist pattern 180 may not be limited, and a single opening 190 or a plurality of openings 190 may be formed.

Figure 7:
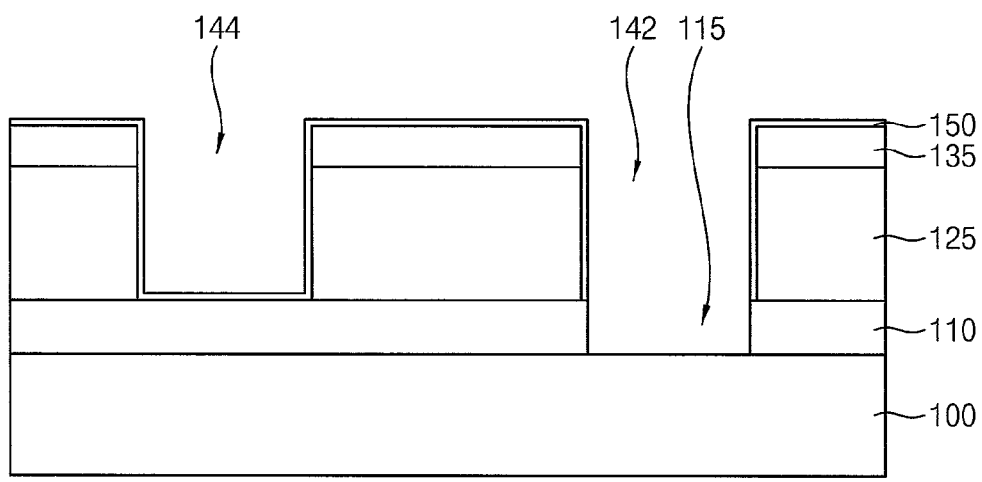

Referring to FIG. 7, the second mask layer 170 may be etched using the second photoresist pattern 180 as an etching mask to form a second mask (not shown), and the filling layer 160, the insulating liner layer 150 and the first insulating interlayer 110 may be sequentially etched using the second mask as an etching mask.

Thus, a via hole 115 connected to the first trench 142 may be formed in the first insulating interlayer 110 to expose an upper surface of the substrate 100. In example embodiments, the via hole 115 may be formed to expose an upper surface of a conductive layer, e.g., a contact plug (not shown) on the substrate 100, and hereinafter, only this case will be illustrated. The contact plug may include a metal, a metal nitride, a metal silicide, etc.

In an example embodiment, when the first trench 142 extends in a direction, the via hole 115 may be connected to a portion of the first trench 142.

The second photoresist pattern 180 and the second mask may be removed, and the remaining filling layer 160 may be removed. The filling layer 160 may be removed by, e.g., an ashing process and/or a stripping process.

Figure 8:
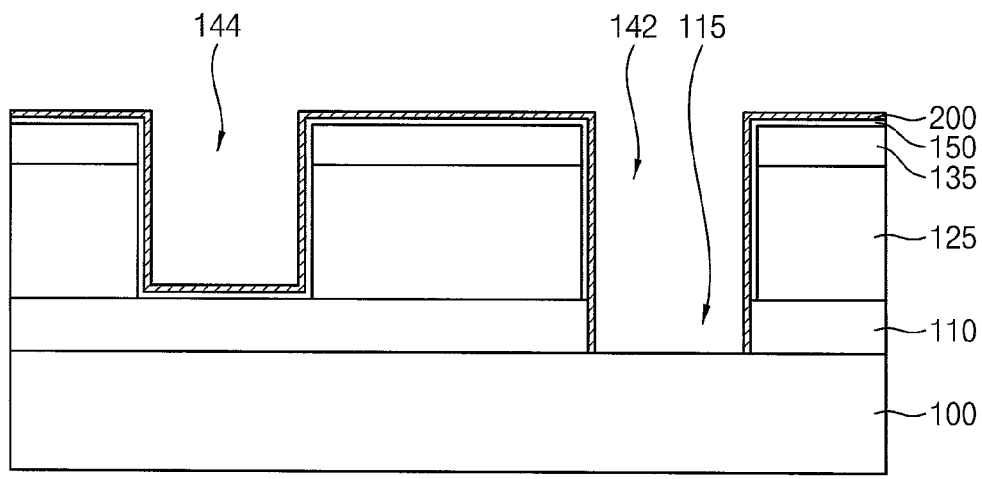

Referring to FIG. 8, an SFB layer 200 may be formed on the insulating liner layer 150, a sidewall of the via hole 115, and the exposed upper surface of the contact plug.

In example embodiments, the SFB layer 200 may be formed by conformally depositing a metal layer including, e.g., manganese, aluminum, vanadium, chrome, etc. on the insulating liner layer 150, the sidewall of the via hole 115, and the exposed upper surface of the substrate 100 or the exposed contact plug through a CVD process or an ALD process.

When the metal layer is deposited, the insulating liner layer 150 including silicon oxide and the first insulating interlayer 110 including silicon oxide and being exposed by the sidewall of the via hole 115 may be reacted with the metal layer to form the SFB layer 200 including, e.g., manganese silicon oxide, aluminum silicon oxide, vanadium silicon oxide or chrome silicon oxide, etc.

A portion of the metal layer on a portion of the underlying layers, e.g., the contact plug may not be chemically reacted, and thus may be removed later.

In example embodiments, the SFB layer 200 may be formed to have a thin thickness equal to or less than about several nanometers, and thus may have a thickness less than that of a barrier layer, e.g., a tantalum nitride layer, a titanium nitride layer, etc. that may be formed by a physical vapor deposition (PVD) process.

Figure 9:
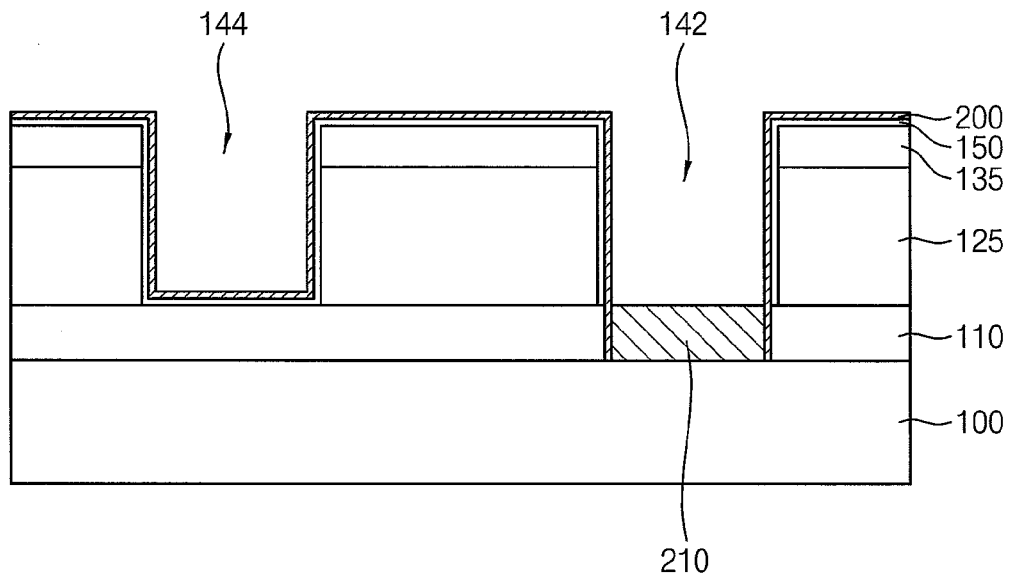

Referring to FIG. 9, a via 210 may be formed on the exposed upper surface of the contact plug.

In example embodiments, the via 210 may be formed only on the exposed upper surface of the contact plug by a selective deposition process. The via 210 may be formed to fill the via hole 115, and thus an upper surface of the via 210 may be substantially coplanar with an upper surface of the first insulating interlayer 110.

The via 210 may be formed of a metal, e.g., cobalt, ruthenium, etc.

Figure 10:
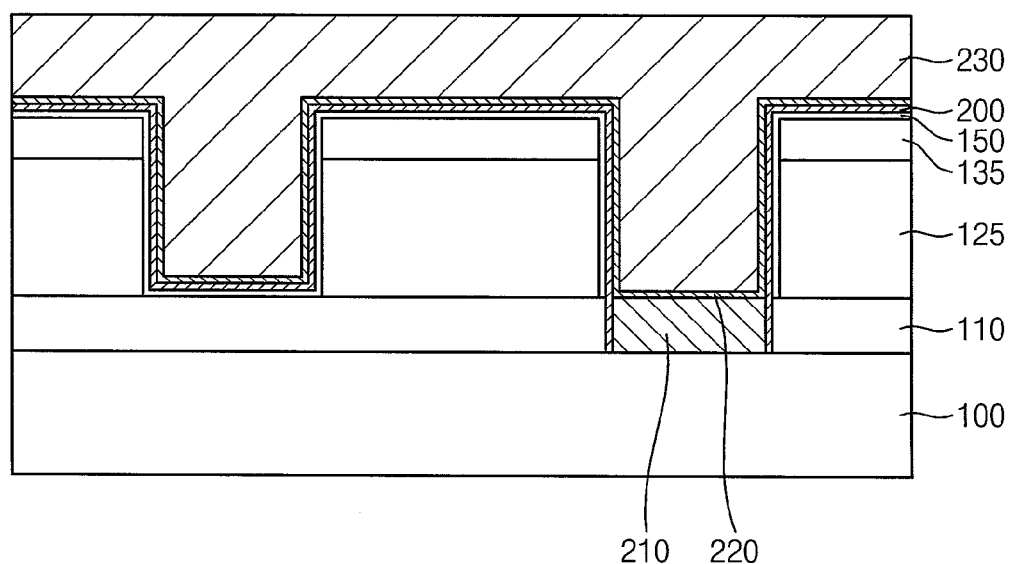

Referring to FIG. 10, a conductive liner layer 220 may be conformally formed on the via 210 and the SFB layer 200, and a wiring layer 230 may be formed to fill the first and second trenches 142 and 144.

The conductive liner layer 220 may be formed of a metal, e.g., cobalt, ruthenium, etc., and thus a portion of the conductive liner layer 220 on the via 210 may be merged thereto. In example embodiments, the conductive liner layer 220 may be formed to have a thin thickness equal to or less than about several nanometers.

The wiring layer 230 may be formed by forming a seed layer (not shown) on the conductive liner layer 220, and performing a plating process. A heat treatment process may be further performed after the plating process.

The wiring layer 230 may be formed of copper or aluminum. The conductive liner layer 220 may be formed on the SFB layer 200 and the via 210, and thus the wiring layer 230 may have improved adhesion thereto.

Figure 11:
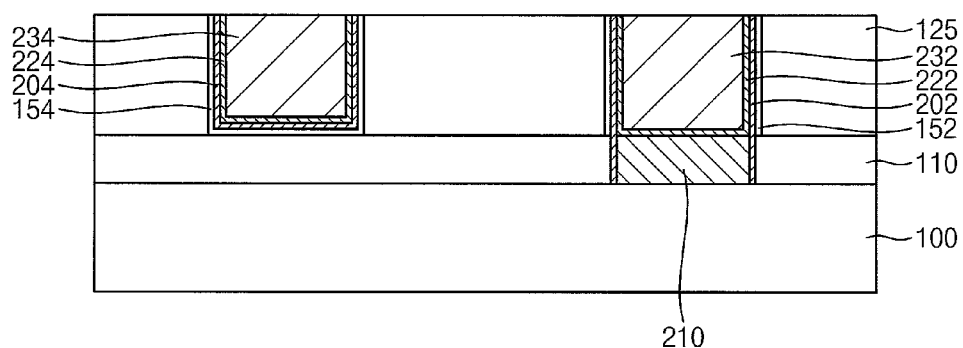

Referring to FIG. 11, the wiring layer 230, the conductive liner layer 220, the SFB layer 200 and the insulating liner layer 150 may be planarized to form first and second wirings 232 and 234, first and second conductive liners 222 and 224, first and second SFB patterns 202 and 204, and first and second insulating liners 152 and 154. The planarization process may be performed until an upper surface of the sacrificial pattern 125 is exposed, and thus the first mask 135 on the sacrificial pattern 125 may be also removed.

The first wiring 232 may be formed in the first trench 142, and a lower surface and a sidewall of the first wiring 232 may be covered by the first conductive liner 222. The via 210, the first conductive liner 222 and the first wiring 232 may form a first wiring structure, and a sidewall of the first wiring structure may be covered by the first SFB pattern 202. The first insulating liner 152 may cover a portion of the first SFB pattern 202 covering the sidewall of the first wiring 232.

The second wiring 234 may be formed in the second trench 144, and a lower surface and a sidewall of the second wiring 234 may be covered by the second conductive liner 224, the second SFB pattern 204 and the second insulating liner 154 sequentially stacked.

Figure 12:
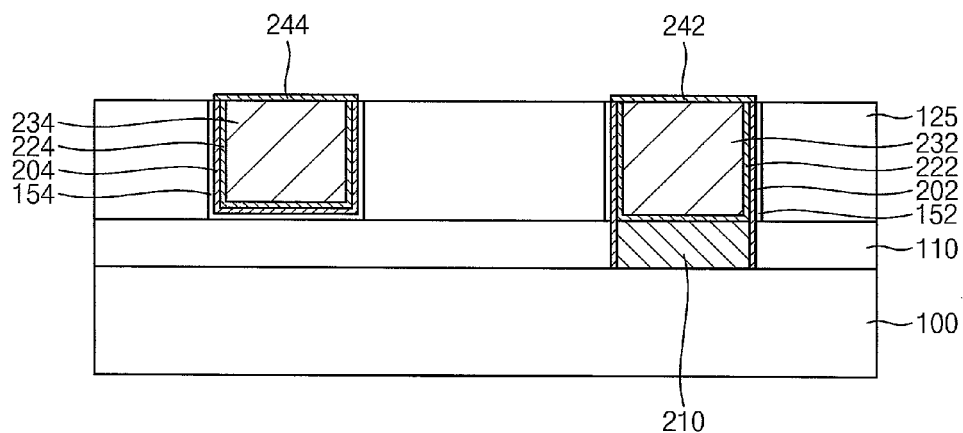

Referring to FIG. 12, first and second capping patterns 242 and 244 may be formed by a selective deposition process.

The first and second capping patterns 242 and 244 may be formed on the first and second wirings 232 and 234, the first and second conductive liners 222 and 224, and the first and second SFB patterns 202 and 204, which may include a metal, by the selective deposition process. Each of the first and second capping patterns 242 and 244 may include, e.g., cobalt, ruthenium, etc.

The first capping pattern 242 may be formed on the first wiring 232, the first conductive liner 222 and the first SFB pattern 202, and the second capping pattern 244 may be formed on the second wiring 234, the second conductive liner 224 and the second SFB pattern 204.

Figure 13:
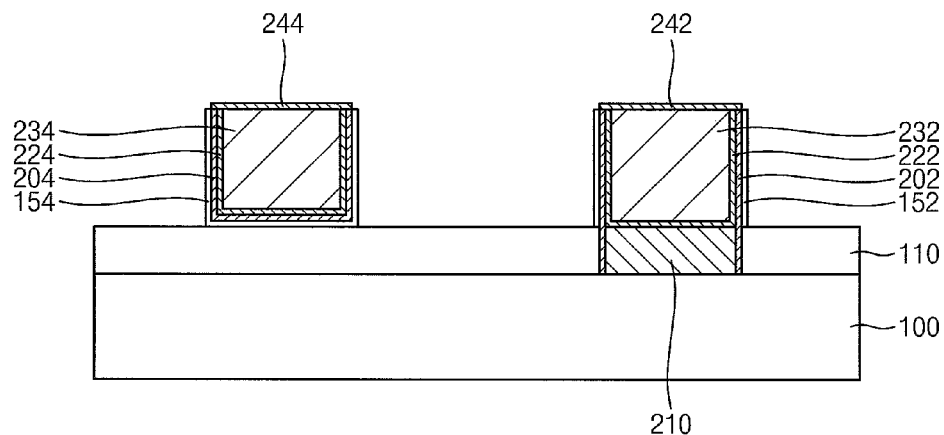

Referring to FIG. 13, the sacrificial pattern 125 may be removed to expose the first and second insulating liners 152 and 154 and the first insulating interlayer 110.

The sacrificial pattern 125 may be removed by an ashing process using, e.g., $N_2H_2$ plasma, and the first and second SFB patterns 202 and 204 may be covered by the first and second insulating liners 152 and 154, respectively, and thus may not be damaged by the ashing process.

Referring to FIG. 1 again, a second insulating interlayer 250 may be formed on the first insulating interlayer 110 to cover the first and second insulating liners 152 and 154, which may cover the sidewalls of the first and second wirings 232 and 234, respectively, and the first and second capping patterns 242 and 244, which may cover upper surfaces of the first and second wirings 232 and 234, respectively.

The second insulating interlayer 250 may be formed of a low-k dielectric material containing silicon oxide but having a dielectric constant lower than that of silicon dioxide ($SiO_2$). For example, the second insulating interlayer 250 may be formed of, silicon oxide doped with carbon (Si-COH), silicon oxide doped with fluorine (F—$SiO_2$), a porous silicon oxide, etc. In some example embodiments, the second insulating interlayer 250 may include a material substantially the same as that of the first insulating interlayer 110 so as to be merged thereto, or the second insulating interlayer 250 may include a material different from that of the first insulating interlayer 110 so as to be distinguished therefrom.

An upper portion of the second insulating interlayer 250 may be planarized to expose the first and second capping patterns 242 and 244, and additional insulating interlayers and wiring structures may be formed on the second insulating interlayer 250 and the exposed first and second capping patterns 242 and 244.

The semiconductor device may be completed by the above processes.

As illustrated above, the first and second insulating liners 152 and 154 including silicon oxide may be formed on the sidewalls of the first and second trenches 142 and 144, respectively, which may be formed by etching the sacrificial layer 120 including amorphous carbon, and the first and second SFB patterns 202 and 204 including a metal silicon oxide may be formed on the first and second insulating liners 152 and 154, respectively. Thus, the first and second SFB patterns 202 and 204 having a thin thickness may be formed on the sidewalls of the first and second wirings 232 and 234, respectively, and the conductive structure including the first and second SFB patterns 202 and 204 may have a low resistance.

The first insulating interlayer 110 exposed by the sidewall of the via hole 115 under the first trench 142 may include silicon oxide, and thus the first SFB pattern 202 may be formed even without an insulating liner.

The first and second trenches 142 and 144 may be formed in the sacrificial layer 120 instead of the second insulating interlayer 250, and after forming the first and second wirings 232 and 234, the sacrificial pattern 125 may be removed and the second insulating interlayer 250 may be formed. Thus, the second insulating interlayer 250 may not have the etching damage, and the parasitic capacitance between the wirings 232 and 234 may be reduced.

Figure 14:
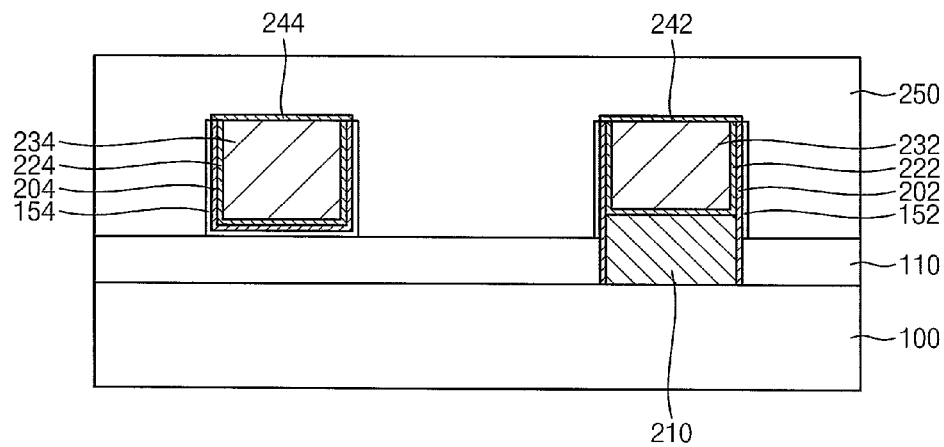
FIG. 14 is a cross-sectional view illustrating a semiconductor device in accordance with example embodiments.

FIG. 14 is a cross-sectional view illustrating a semiconductor device in accordance with example embodiments. The semiconductor device may be substantially the same as or similar to that of FIG. 1, except for the sizes of the via 210 and the first wiring 232. Thus, like reference numerals refer to like elements, and detailed descriptions thereon may be omitted below in the interest of brevity.

Referring to FIG. 14, the via 210 may extend through the first insulating interlayer 110, and further extend in the second insulating interlayer 250. Thus, an upper portion of the via 210 may be formed in the second insulating interlayer 250. A height of an upper surface of the via 210 may be higher than that of an upper surface of the first insulating interlayer 110 or a lower surface of the second insulating interlayer 250.

The first and second wirings 232 and 234 may be formed in the second insulating interlayer 250, and the first wiring 232 may be formed on the via 210. The height of the upper surface of the via 210 may be higher than that of the lower surface of the second insulating interlayer 250, and thus a height of a lower surface of the first wiring 232 on the via 210 may be higher than that of the lower surface of the second insulating interlayer 250 and may be also higher than that of a lower surface of the second wiring 234. The first and second wirings 232 and 234 may include the lower surfaces having different heights, however, upper surfaces of the first and second wirings 232 and 234 may be substantially coplanar with each other. Thus, the first and second wirings 232 and 234 may have different thicknesses.

Figure 15:
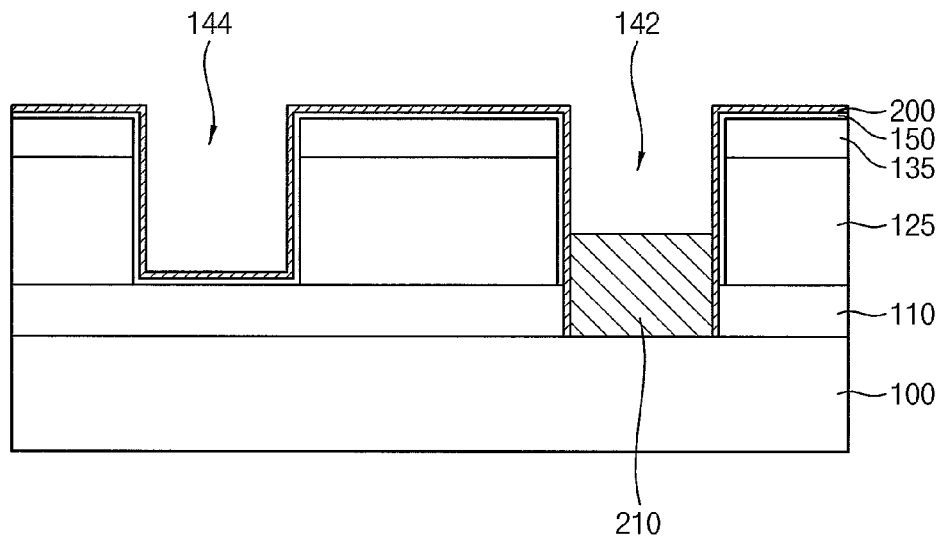
FIG. 15 is a cross-sectional view illustrating stages of a method of manufacturing a semiconductor device in accordance with example embodiments.

FIG. 15 is a cross-sectional view illustrating stages of a method of manufacturing a semiconductor device in accordance with example embodiments. This method may include processes substantially the same as or similar to those illustrated with reference to FIGS. 2 to 13 and FIG. 1, and thus detailed descriptions thereon are omitted herein.

First, processes substantially the same as or similar to those illustrated with reference to FIGS. 2 to 8 may be performed.

Referring to FIG. 15, processes substantially the same as or similar to those illustrated with reference to FIG. 9 may be performed.

Thus, a via 210 may be formed on the exposed upper surface of the contact plug. However, the via 210 may be formed not only to fill the via hole 115 but also fill a lower portion of the first trench 142, and thus a height of an upper surface of the via 210 may be higher than that of an upper surface of the first insulating interlayer 110.

Processes substantially the same as or similar to those illustrated with reference to FIGS. 10 to 13 and FIG. 1 may be performed to complete the semiconductor device shown in FIG. 14.

Figure 16:
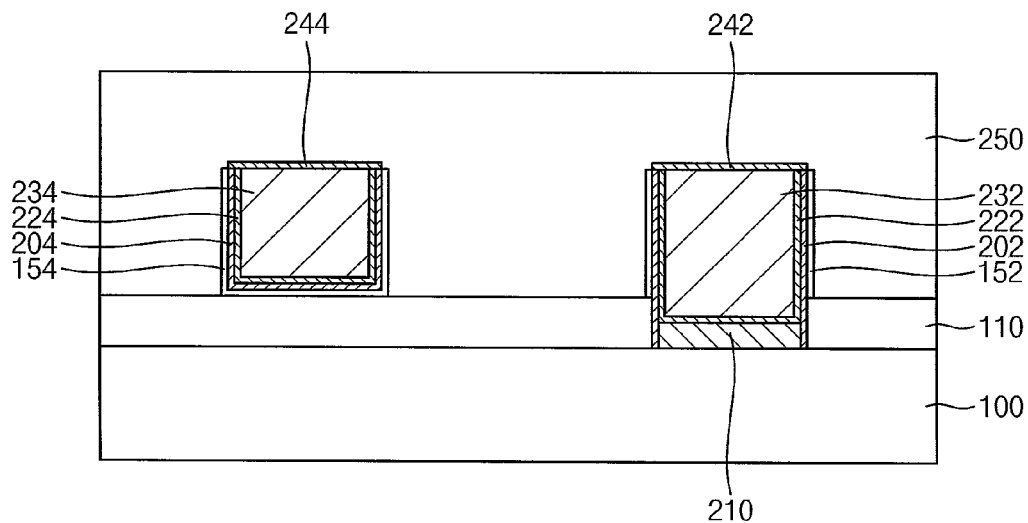
FIG. 16 is a cross-sectional view illustrating a semiconductor device in accordance with example embodiments.

FIG. 16 is a cross-sectional view illustrating a semiconductor device in accordance with example embodiments. The semiconductor device may be substantially the same as or similar to that of FIG. 1, except for the sizes of the via 210 and the first wiring 232. Thus, like reference numerals refer to like elements, and detailed descriptions thereon may be omitted below in the interest of brevity.

Referring to FIG. 16, the via 210 may extend through only a portion of the first insulating interlayer 110. Thus, a height of a lower surface of the via 210 may be lower than that of a lower surface of the second insulating interlayer 250 and a lower surface of the second wiring 234. That is, the first and second wirings 232 and 234 may include the lower surfaces having different heights, however, upper surfaces of the first and second wirings 232 and 234 may be substantially coplanar with each other. Thus, the first and second wirings 232 and 234 may have different thicknesses.

Figure 17:
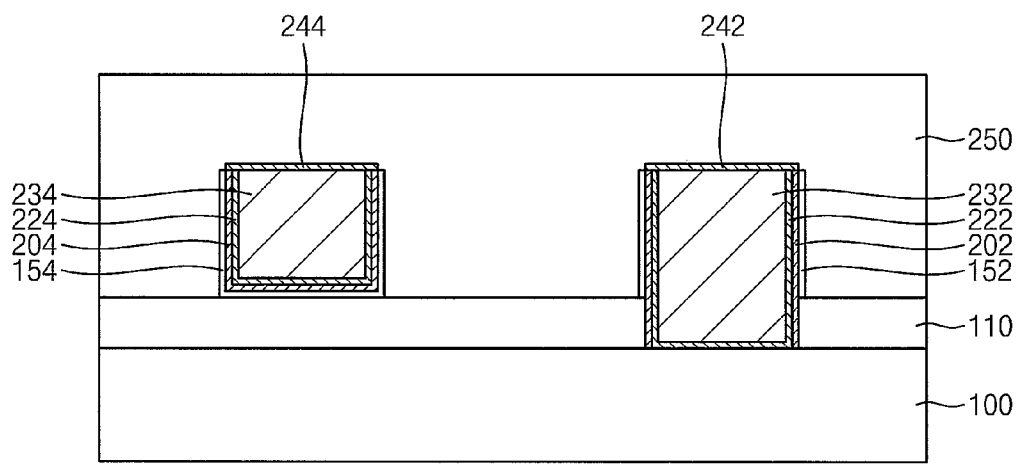
FIG. 17 is a cross-sectional view illustrating a semiconductor device in accordance with example embodiments.

FIG. 17 is a cross-sectional view illustrating a semiconductor device in accordance with example embodiments. The semiconductor device may be substantially the same as or similar to that of FIG. 1, except for the via 210 and the first wiring 232. Thus, like reference numerals refer to like elements, and detailed descriptions thereon may be omitted below in the interest of brevity.

Referring to FIG. 17, the semiconductor device may have no via that may be differentiated from the first wiring 232. That is, the first wiring 232 may be formed not only in the second insulating interlayer 250 but also in the first insulating interlayer 110, and may directly contact an upper surface of the underlying contact plug (not shown).

Thus, a height of a lower surface of the first wiring 232 may be substantially coplanar with a lower surface of the first insulating interlayer 110. That is, the first and second wirings 232 and 234 may include the lower surfaces having different heights, however, upper surfaces of the first and second wirings 232 and 234 may be substantially coplanar with each other. Thus, the first and second wirings 232 and 234 may have different thicknesses.

Figure 18:
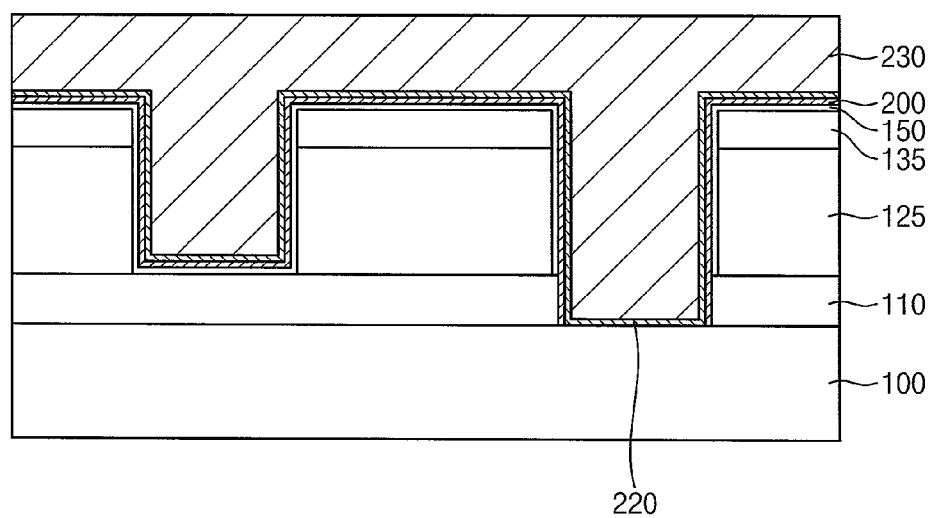
FIG. 18 is a cross-sectional view illustrating stages of a method of manufacturing a semiconductor device in accordance with example embodiments.

FIG. 18 is a cross-sectional view illustrating stages of a method of manufacturing a semiconductor device in accordance with example embodiments. This method may include processes substantially the same as or similar to those illustrated with reference to FIGS. 2 to 13 and FIG. 1, and thus detailed descriptions thereon are omitted herein.

First, processes substantially the same as or similar to those illustrated with reference to FIGS. 2 to 8 may be performed.

Referring to FIG. 18, processes substantially the same as or similar to those illustrated with reference to FIG. 10 may be performed.

That is, the process illustrated with reference to FIG. 9 may not be performed, and the process for forming the conductive liner layer 220 and the wiring layer 230 illustrated with reference to FIG. 10 may be performed.

Thus, the conductive liner layer 220 may be formed on the exposed upper surface of the contact plug, and the sidewalls of the via hole 115 and the first and second trenches 142 and 144, and the wiring layer 230 may be formed on the conductive liner layer 220 to fill the via hole 115 and the first and second trenches 142 and 144.

Processes substantially the same as or similar to those illustrated with reference to FIGS. 10 to 13 and FIG. 1 may be performed to complete the semiconductor device shown in FIG. 17.

Figure 19:
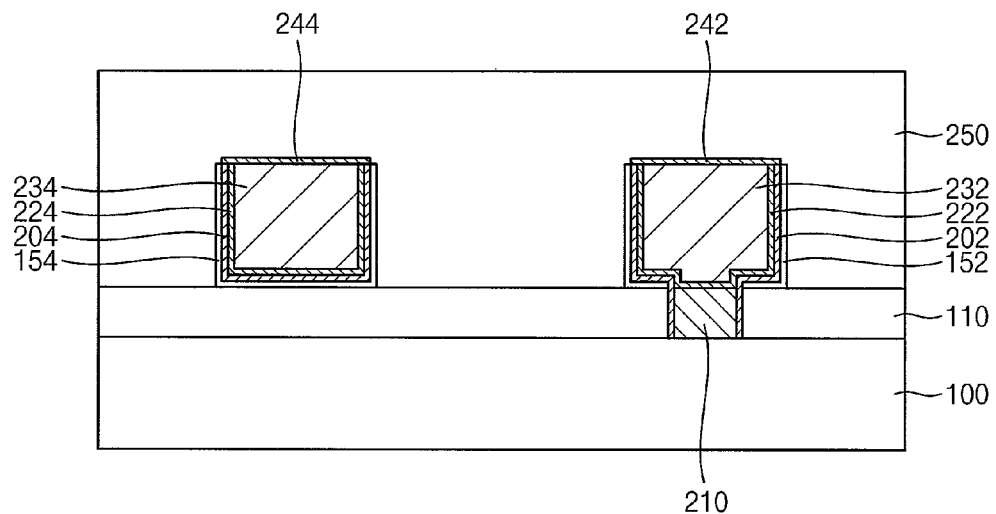
FIG. 19 is a cross-sectional view illustrating a semiconductor device in accordance with example embodiments.
Figure 20:
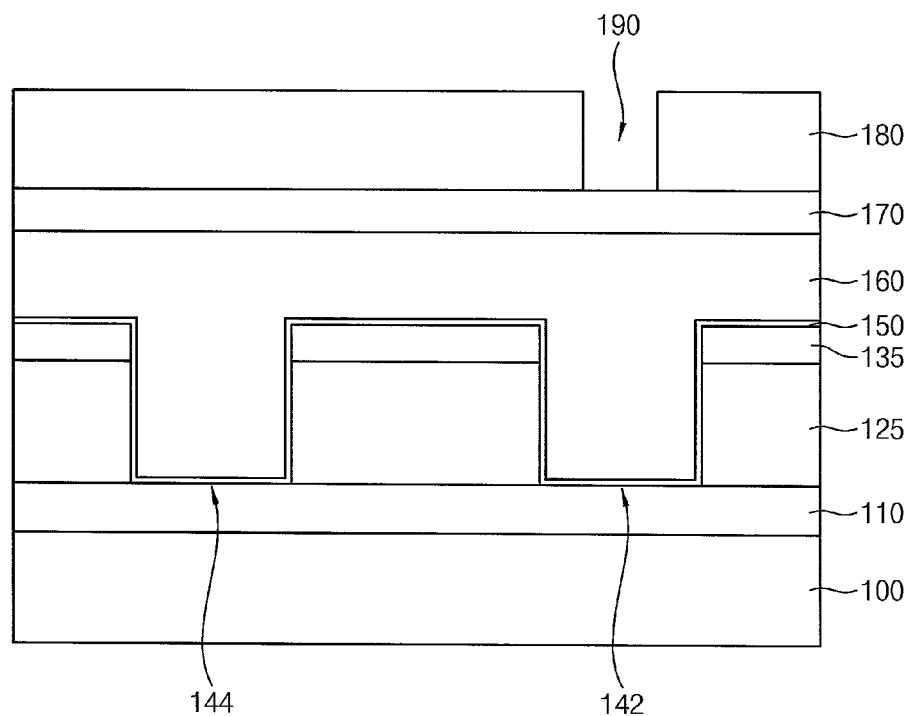
FIGS. 20 to 23 are cross-sectional views illustrating stages of a method of manufacturing a semiconductor device in accordance with example embodiments.

FIG. 19 is a cross-sectional view illustrating a semiconductor device in accordance with example embodiments. The semiconductor device may be substantially the same as or similar to that of FIG. 1, except for the shapes and sizes of the via 210 and the first wiring 232. Thus, like reference numerals refer to like elements, and detailed descriptions thereon may be omitted below in the interest of brevity.

Referring to FIG. 19, the via 210 may have a width in a direction less than a width of the first wiring 232 in the direction.

A central lower surface of the first wiring 232 may protrude downwardly, and the first SFB pattern 202 may cover a sidewall of a first wiring structure including the via 210, the first conductive liner 222 and the first wiring 232. The first SFB pattern 202 may include a first portion extending in a direction substantially perpendicular to the upper surface of the substrate, and a second portion extending in a direction substantially parallel to the upper surface of the substrate 100. Thus, the first SFB pattern 202 may cover a portion of the first conductive liner 222 covering a sidewall and an edge lower surface of the first wiring 232, and a sidewall of the via 210.

The first insulating liner 152 may also include a first portion extending in the direction substantially perpendicular to the upper surface of the substrate, and a second portion extending in the direction substantially parallel to the upper surface of the substrate 100. Thus, the first insulating liner 152 may cover a portion of the first SFB pattern 202 covering the sidewall and the edge lower surface of the first wiring 232.

FIGS. 20 to 23 are cross-sectional views illustrating stages of a method of manufacturing a semiconductor device in accordance with example embodiments. This method may include processes substantially the same as or similar to those illustrated with reference to FIGS. 2 to 13 and FIG. 1, and thus detailed descriptions thereon are omitted herein.

First, processes substantially the same as or similar to those illustrated with reference to FIGS. 2 to 6 may be performed.

However, the opening 190 in the second photoresist pattern 180 may have a width in a direction less than a width of the first trench 142 in the direction.

Figure 21:
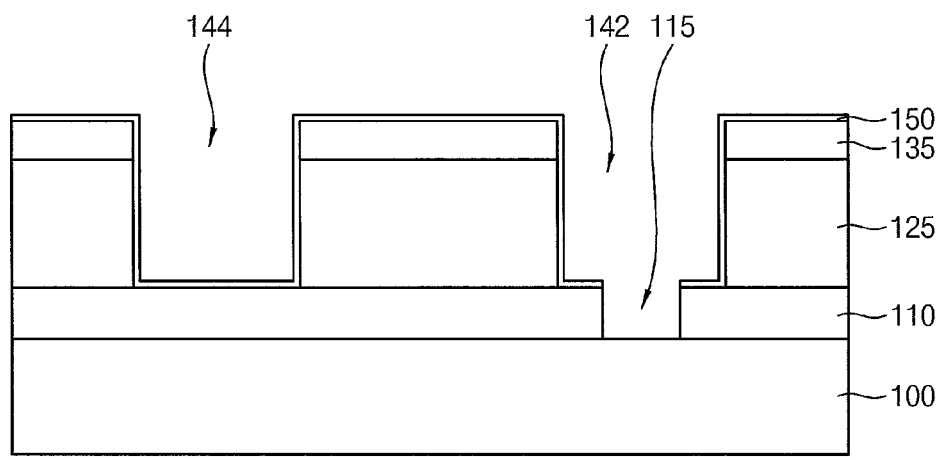

Referring to FIG. 21, processes substantially the same as or similar to those illustrated with reference to FIG. 7 may be performed.

Thus, a via hole 115 connected to the first trench 142 may be formed in the first insulating interlayer 110 to expose an upper surface of the substrate 100. A width of the via hole 115 in the direction may be less than that of the first trench 142.

A portion of the insulating liner layer 150 on an edge bottom of the first trench 142 may not be removed but remain.

Figure 22:
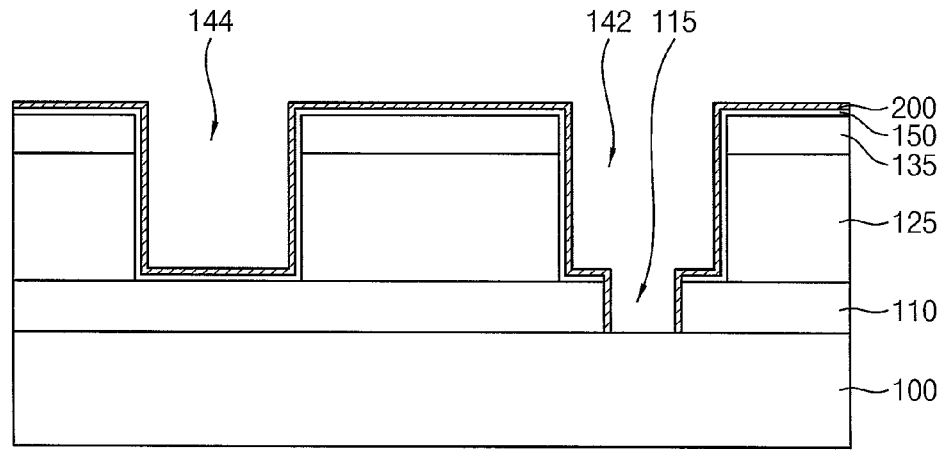

Referring to FIG. 22, processes substantially the same as or similar to those illustrated with reference to FIG. 8 may be performed.

Thus, an SFB layer 200 may be formed on the insulating liner layer 150, a sidewall of the via hole 115 and the exposed upper surface of the contact plug may be formed.

Figure 23:
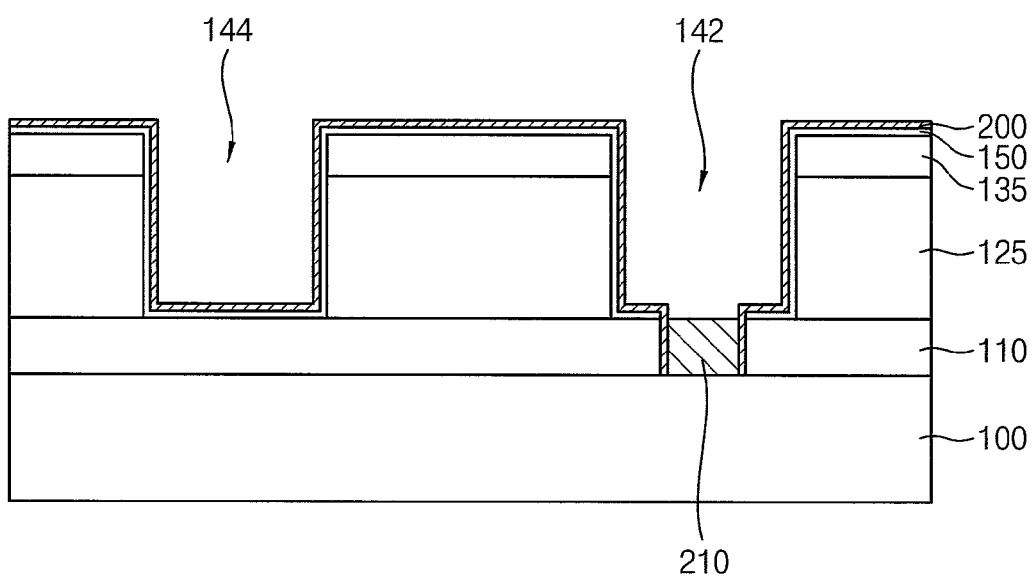

Referring to FIG. 23, processes substantially the same as or similar to those illustrated with reference to FIG. 9 may be performed.

Thus, a via 210 may be formed on the exposed upper surface of the contact plug.

Processes substantially the same as or similar to those illustrated with reference to FIGS. 10 to 13 and FIG. 1 may be performed to complete the semiconductor device shown in FIG. 19.

FIGS. 24 to 56 are plan views and cross-sectional views illustrating stages of a method of manufacturing a semiconductor device in accordance with example embodiments. Particularly, FIGS. 24, 26, 29, 32, 35, 38, 41, 43, 46, 49 and 53 are plan views, and FIGS. 25, 27-28, 30-31, 33-34, 36-37, 39-40, 42, 44-45, 47-48, 50-52 and 54-56 are cross-sectional views.

FIGS. 25, 30, 33, 36, 39, 47, 50 and 54 are cross-sectional views taken along lines A-A' of corresponding plan views, respectively, FIGS. 27, 44, 51 and 55 are cross-sectional views taken along lines B-B' of corresponding plan views, respectively, and FIGS. 28, 31, 34, 37, 40, 42, 45, 48, 52 and 56 are cross-sectional views taken along lines C-C' of corresponding plan views, respectively.

Figure 24:
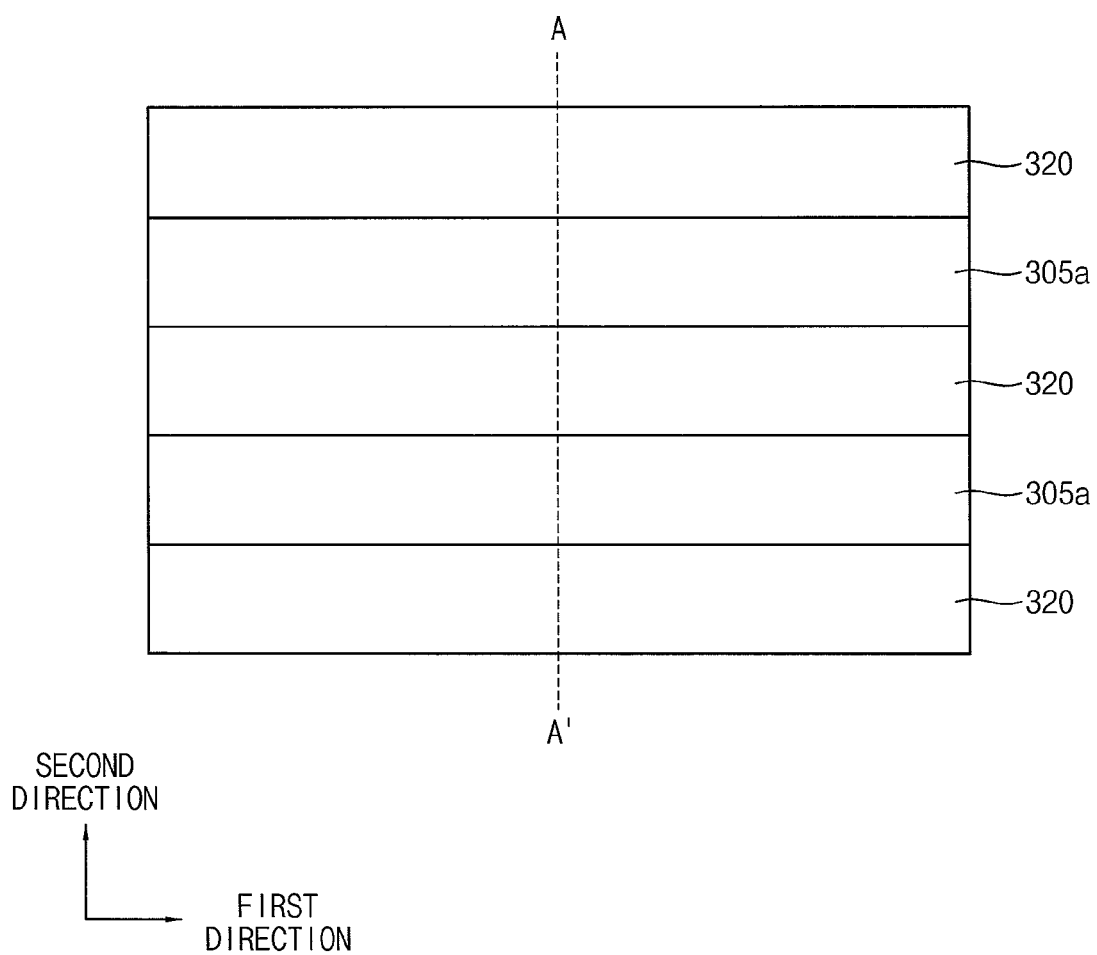
Figure 25:
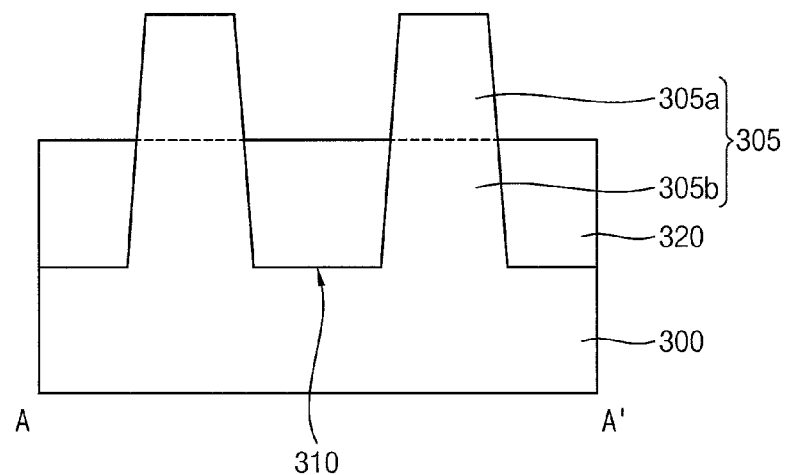
Figure 25:
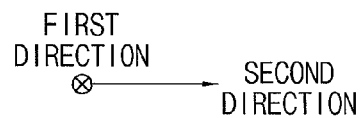

Referring to FIGS. 24 and 25, an upper portion of a substrate 300 may be partially etched to form a first recess 310, and an isolation pattern 320 filling a lower portion of the first recess 310 may be formed.

As the first recess 310 is formed on the substrate 300, an active region 305 may be defined on the substrate 300. The active region 305 may protrude from an upper surface of the substrate 300, and thus may be also referred to as an active fin. A region of the substrate 300 on which the active fin 305 is not formed may be referred to as a field region.

In example embodiments, the active fin 305 may extend in a first direction substantially parallel to the upper surface of the substrate 300, and a plurality of active fins 305 may be formed in a second direction, which may be substantially parallel to the upper surface of the substrate 300 and cross the first direction. In example embodiments, the first and second directions may cross each other at a right angle, and thus may be substantially perpendicular to each other.

In example embodiments, the isolation pattern 320 may be formed by forming an isolation layer on the substrate 300 to sufficiently fill the recess 310, planarizing the isolation layer until the upper surface of the substrate 300 may be exposed, and removing an upper portion of the isolation layer to expose an upper portion of the recess 310. The isolation layer may be formed of an oxide, e.g., silicon oxide.

In example embodiments, the active fin 305 may include a lower active pattern 305b whose sidewall may be covered by the isolation pattern 320, and an upper active pattern 305a not covered by the isolation pattern 320 but protruding therefrom. In example embodiments, the upper active pattern 305a may have a width in the second direction that may be slightly less than a width of the lower active pattern 305b.

Figure 26:
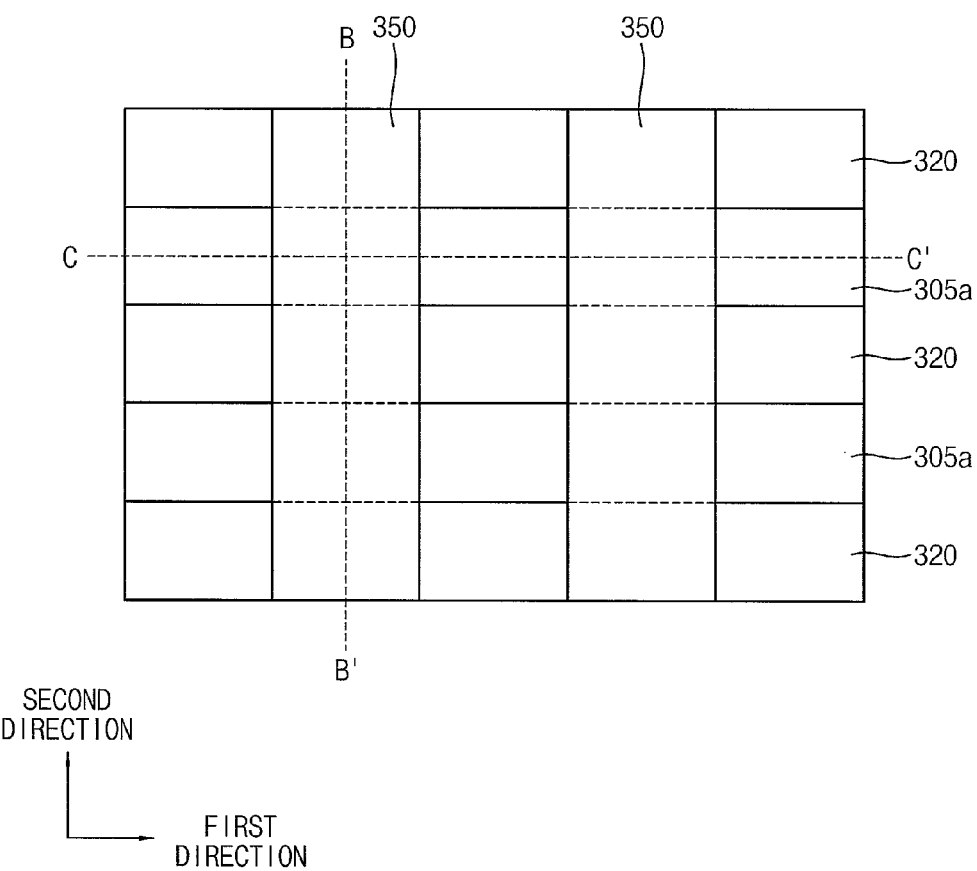
Figure 27:
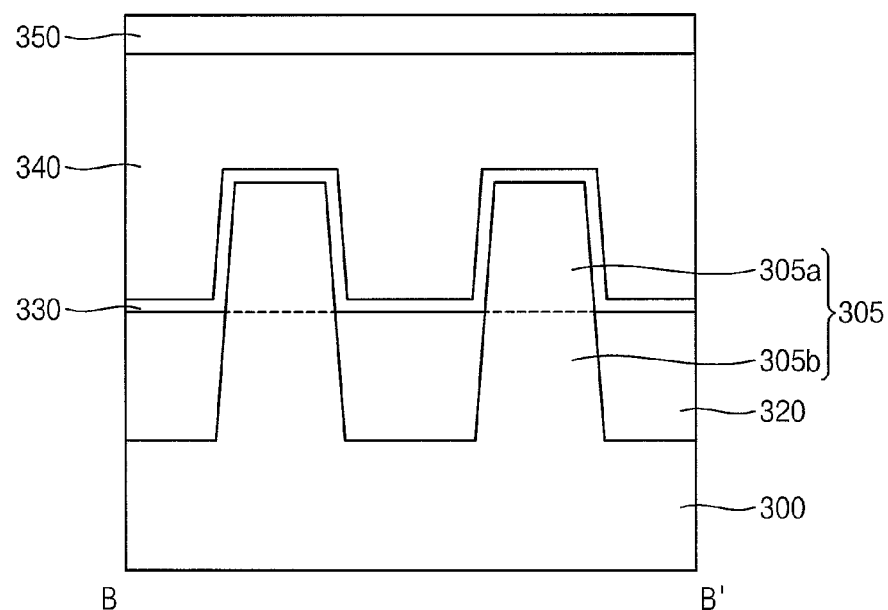
Figure 27:
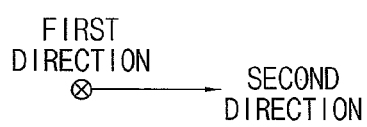
Figure 28:
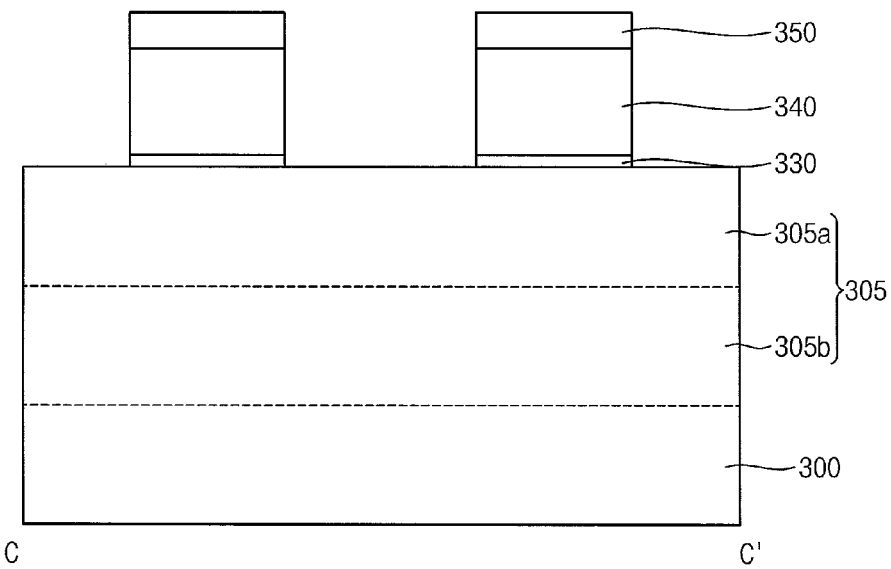

Referring to FIGS. 26 to 28, a dummy gate structure may be formed on the substrate 300.

The dummy gate structure may be formed by sequentially forming a dummy gate insulation layer, a dummy gate electrode layer and a dummy gate mask layer on the substrate 300 and the isolation pattern 320, patterning the dummy gate mask layer to form a dummy gate mask 350, and sequentially etching the dummy gate electrode layer and the dummy gate insulation layer using the dummy gate mask 350 as an etching mask.

Thus, the dummy gate structure may include a dummy gate insulation pattern 330, a dummy gate electrode 340 and the dummy gate mask 350 sequentially stacked on the substrate 300.

The dummy gate insulation layer may be formed of an oxide, e.g., silicon oxide, the dummy gate electrode layer may be formed of, e.g., polysilicon, and the dummy gate mask layer may be formed of a nitride, e.g., silicon nitride.

The dummy gate insulation layer may be formed by a chemical vapor deposition (CVD) process, an atomic layer deposition (ALD) process, etc. Alternatively, the dummy gate insulation layer may be formed by a thermal oxidation process on an upper portion of the substrate 300, and in this case, the dummy gate insulation layer may be formed only on the upper active pattern 305a. The dummy gate electrode layer and the dummy gate mask layer may be formed by a CVD process, an ALD process, etc.

In example embodiments, the dummy gate structure may be formed to extend in the second direction, and a plurality of dummy gate structures may be formed in the first direction.

Figure 29:
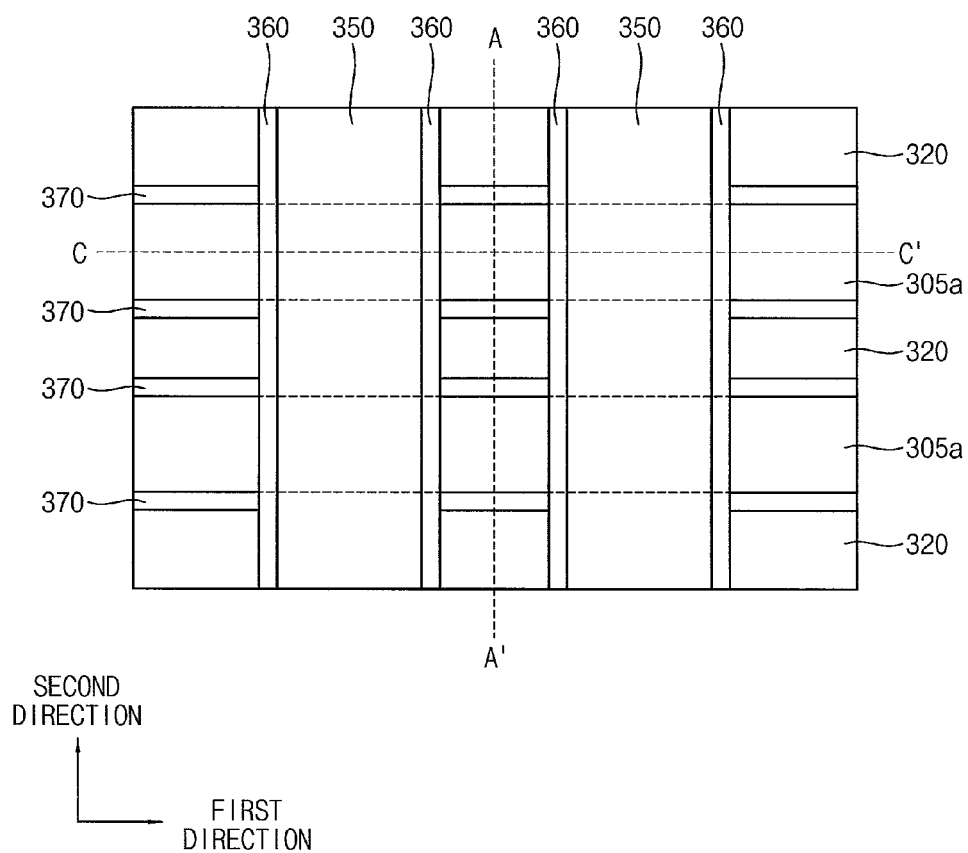
Figure 30:
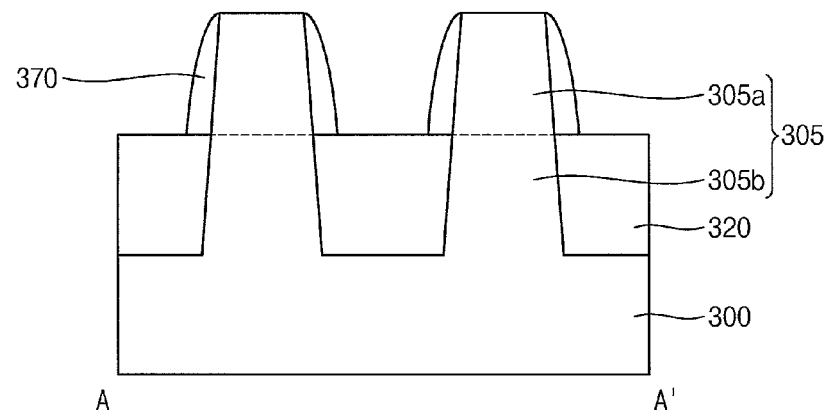
Figure 31:
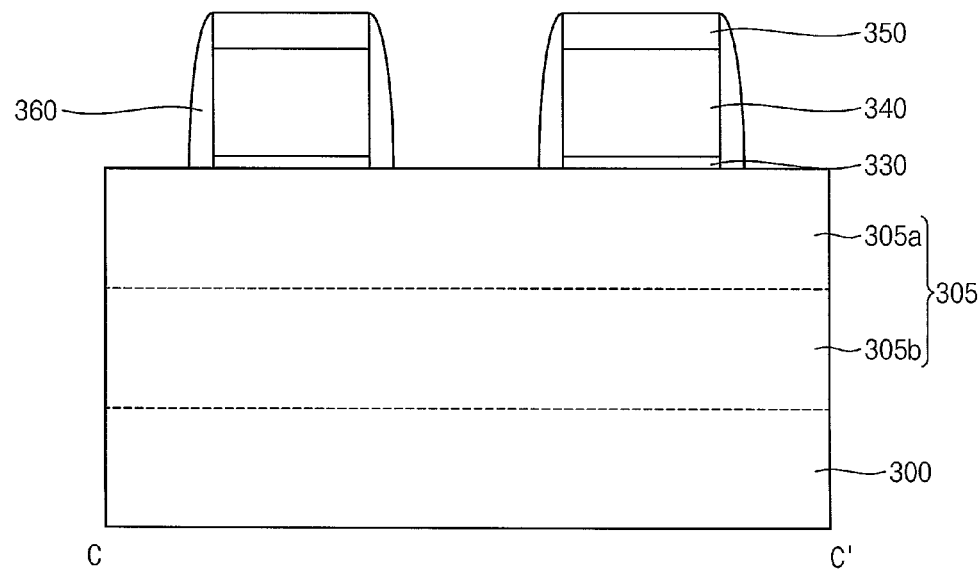

Referring to FIGS. 29 to 31, a spacer layer may be formed on the active fin 305 of the structure 300 and the isolation pattern 320 to cover the dummy gate structure, and may be anisotropically etched to form a gate spacer 360 on each of opposite sidewalls of the dummy gate structure in the first direction. A fin spacer 370 may be formed on each of opposite sidewalls of the upper active pattern 305a in the second direction.

The spacer layer may be formed of a nitride, e.g., silicon nitride.

Figure 32:
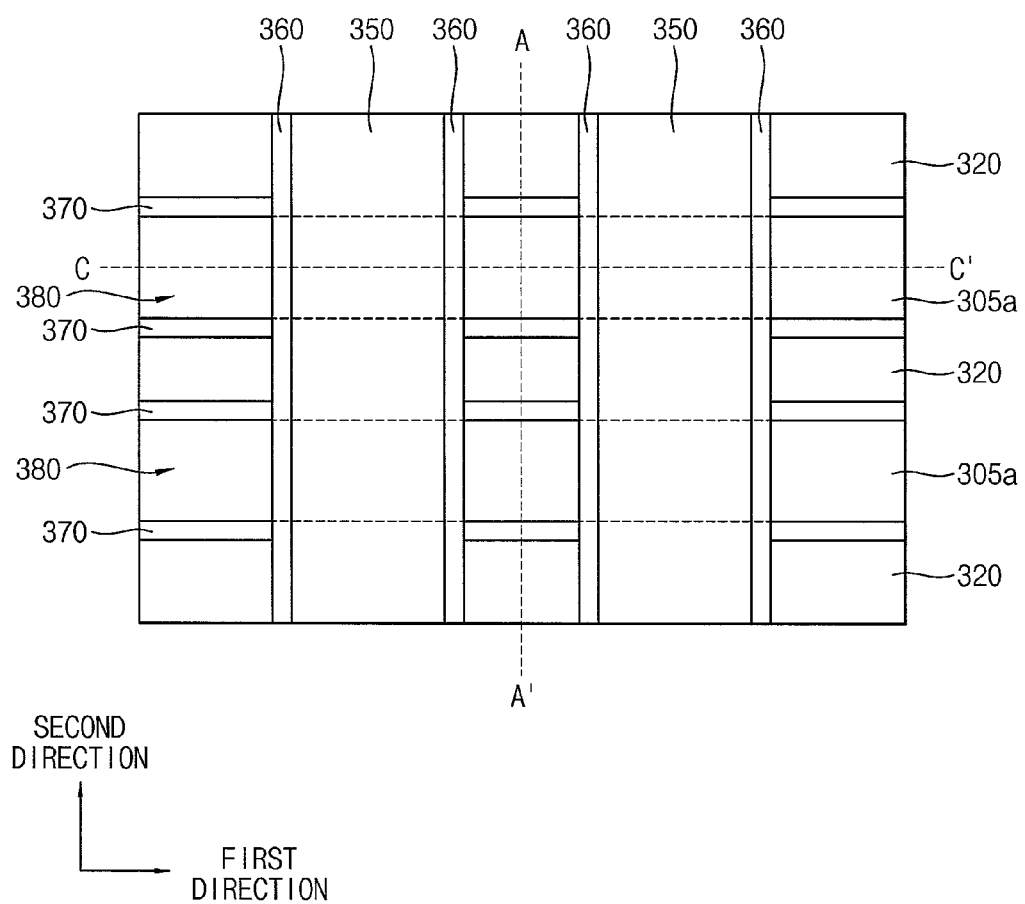
Figure 33:
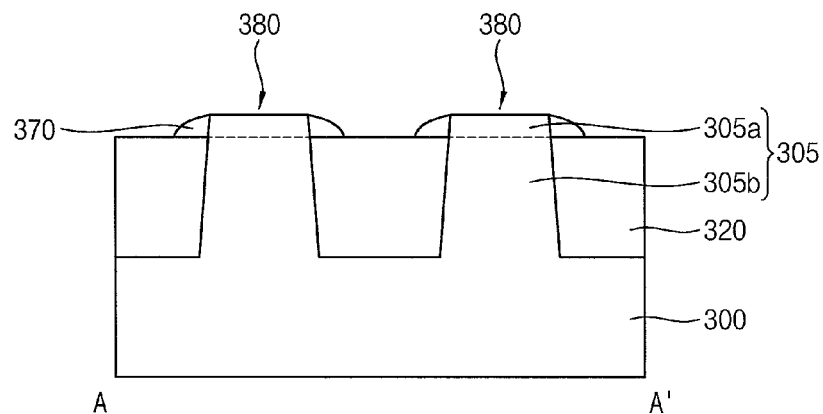
Figure 34:
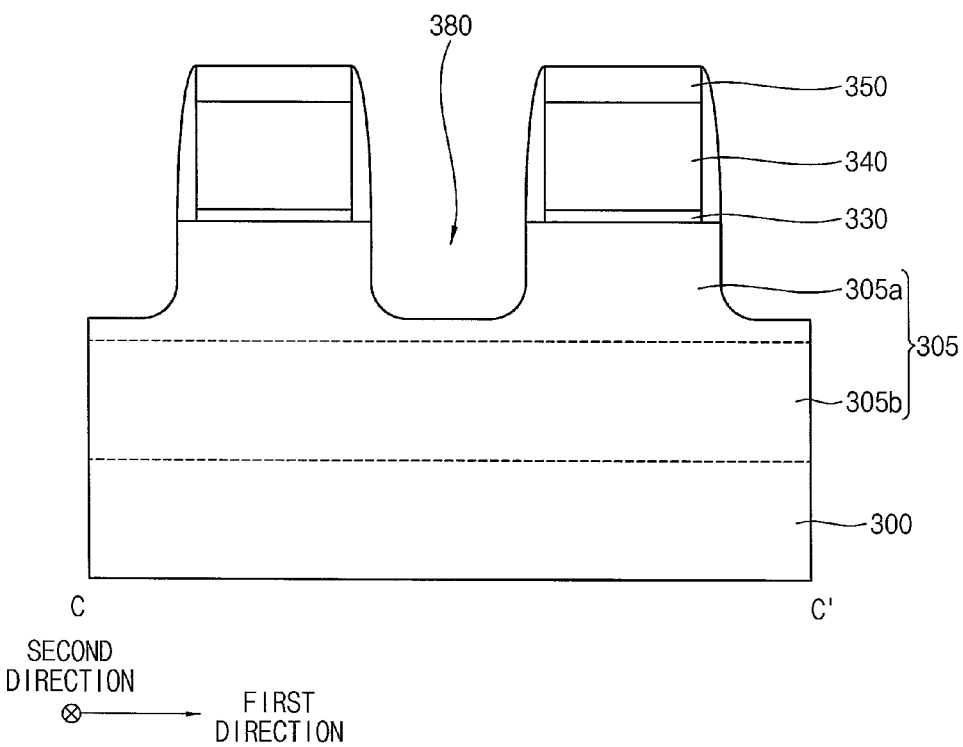

Referring to FIGS. 32 to 34, an upper portion of the active fin 305 adjacent the gate spacer 360 may be etched to form a second recess 380.

In the figures, only a portion of the upper active pattern 305a of the active fin 305 is etched to form the second recess 380, and thus a bottom of the second recess 380 is higher than an upper surface of the lower active pattern 305b, however, the inventive concepts may not be limited thereto.

In some cases, not only a portion of the upper active pattern 305a but also a portion of the lower active pattern 305b may be etched to form the second recess 380, and thus the bottom of the second recess 380 may be lower than an upper surface of the lower active pattern 305b where the second recess 380 is not formed.

When the second recess 380 is formed, the fin spacer 370 adjacent the upper active pattern 305b may be also removed partially or completely.

In example embodiments, the etching process for forming the second recess 380 and the etching process for forming the gate spacer 360 and the fin spacer 370 may be performed in-situ.

Figure 35:
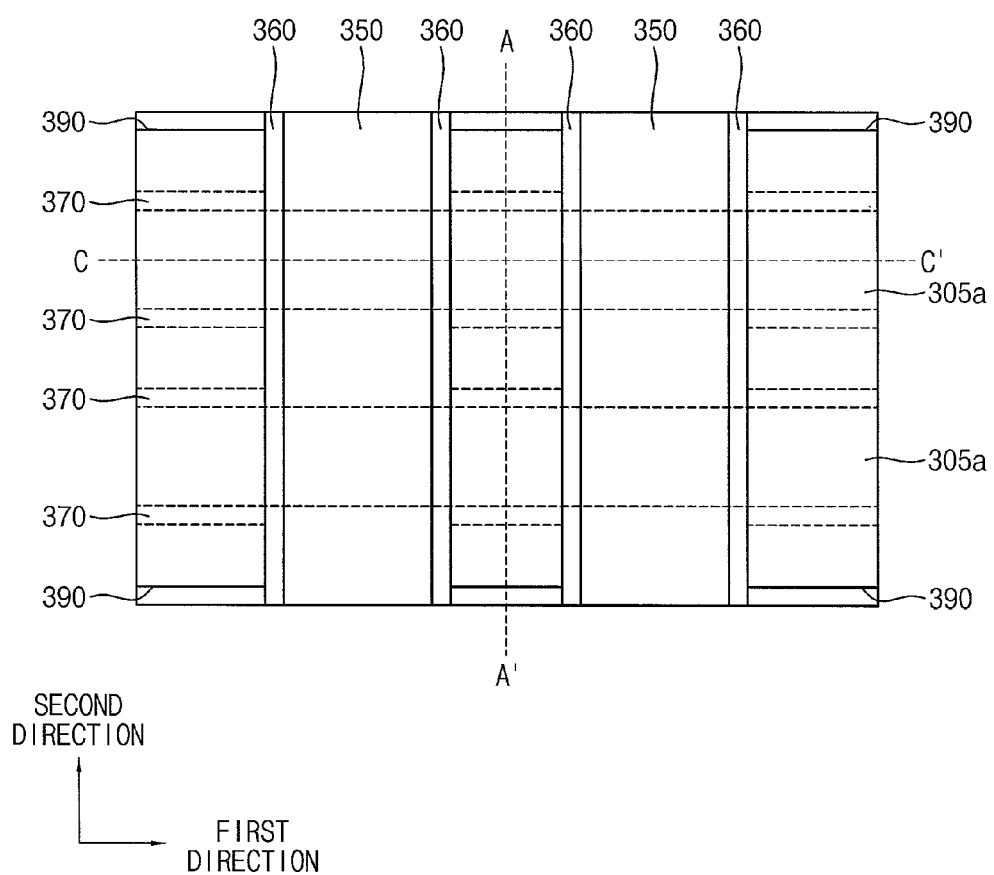
Figure 36:
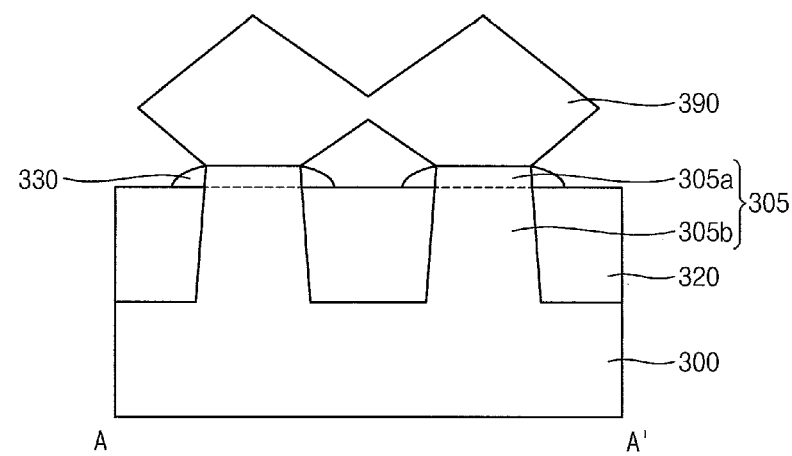
Figure 37:
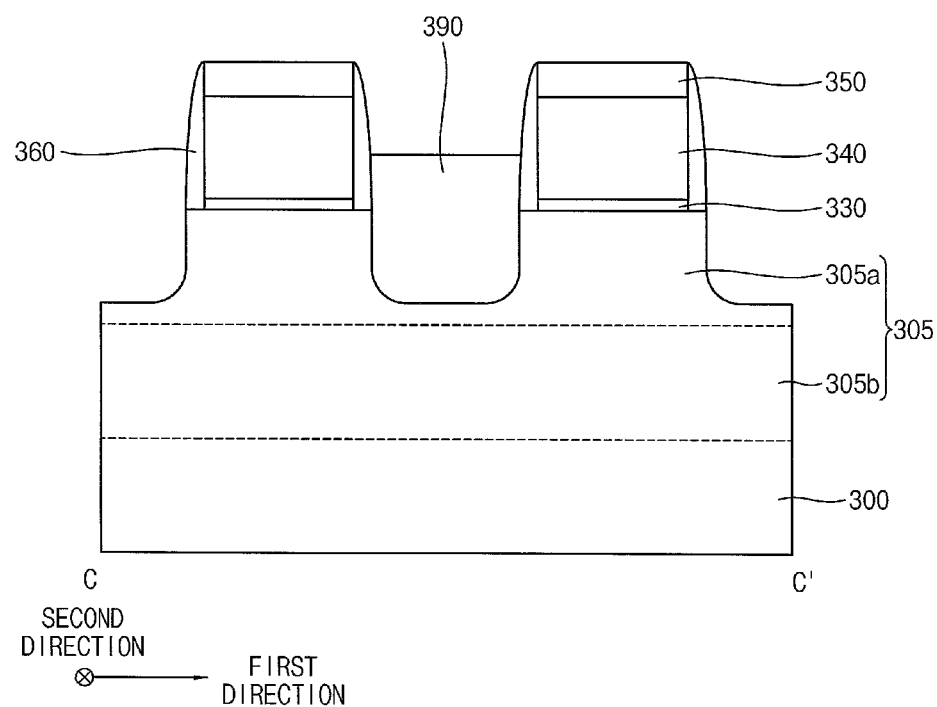

Referring to FIGS. 35 to 37, a source/drain layer 390 may be formed in the second recess 380.

In example embodiments, the source/drain layer 390 may be formed by a selective epitaxial growth (SEG) process using an upper surface of the active fin 305 exposed by the second recess 380 as a seed.

In example embodiments, the SEG process may be formed by providing a silicon source gas, a germanium source gas, an etching gas and a carrier gas, and thus a single crystalline silicon-germanium layer may be formed to serve as the source/drain layer 390. Additionally, a p-type impurity source gas may be also used to form a single crystalline silicon-germanium layer doped with p-type impurities serving as the source/drain layer 390. Thus, the source/drain layer 390 may serve as a source/drain region of a positive-channel metal oxide semiconductor (PMOS) transistor.

Alternatively, the SEG process may be formed using a silicon source gas, a carbon source gas, an etching gas and a carrier gas, and thus a single crystalline silicon carbide layer may be formed as the source/drain layer 390. Additionally, an n-type impurity source gas may be also used to form a single crystalline silicon carbide layer doped with n-type impurities. Alternatively, the SEG process may be performed using a silicon source gas, an etching gas and a carrier gas, and thus a single crystalline silicon layer may be formed as the source/drain layer 390. In the SEG process, an n-type impurity source gas may be also used to form a single crystalline silicon layer doped with n-type impurities. Thus, the source/drain layer 390 may serve as a source/drain region of a negative-channel metal oxide semiconductor (NMOS) transistor.

The source/drain layer 390 may grow not only in a vertical direction but also in a horizontal direction to fill the second recess 380, and may contact a sidewall of the gate spacer 360. In example embodiments, the source/drain layer 390 may have a cross-section taken along the second direction, and the cross-section of the source/drain layer 390 may have a shape similar to a pentagon.

In example embodiments, when the active fins 305 disposed in the second direction are close to each other, the source/drain layers 390 growing on the respective active fins 305 may be merged with each other. FIGS. 35 to 37 show that two source/drain layers 390 grown on neighboring two active fins 305 are merged with each other, however, the inventive concepts may not be limited thereto. Thus, more than two source/drain layers 390 may be merged with each other.

Figure 38:
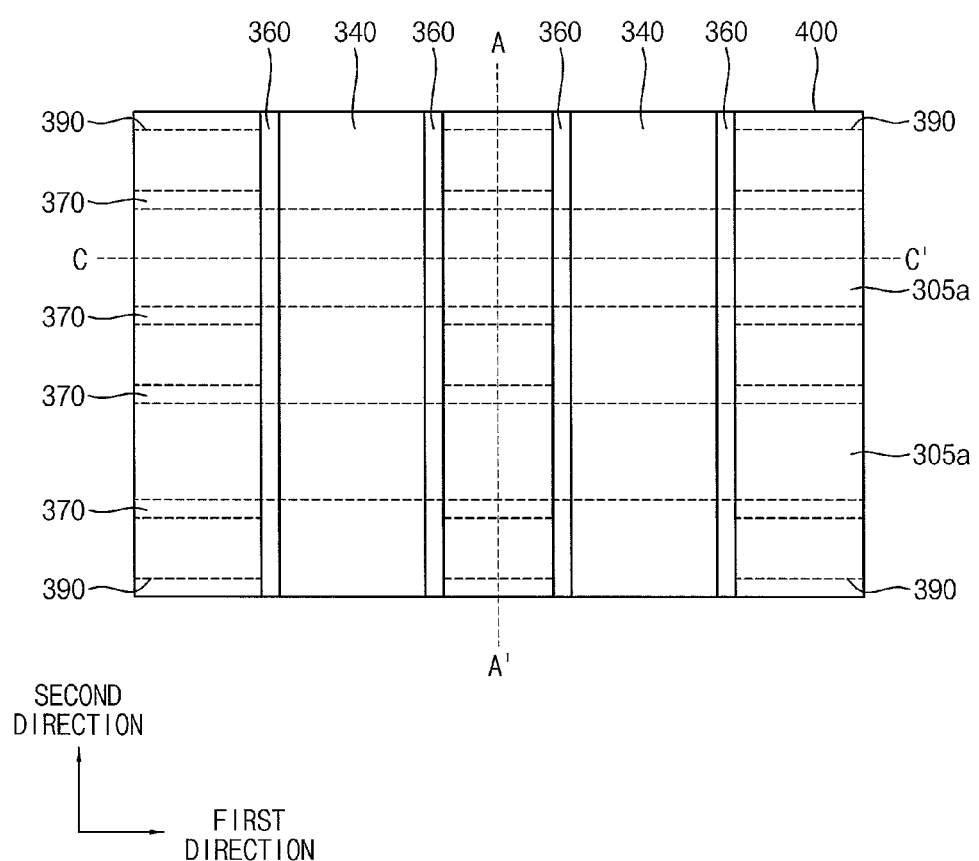
Figure 39:
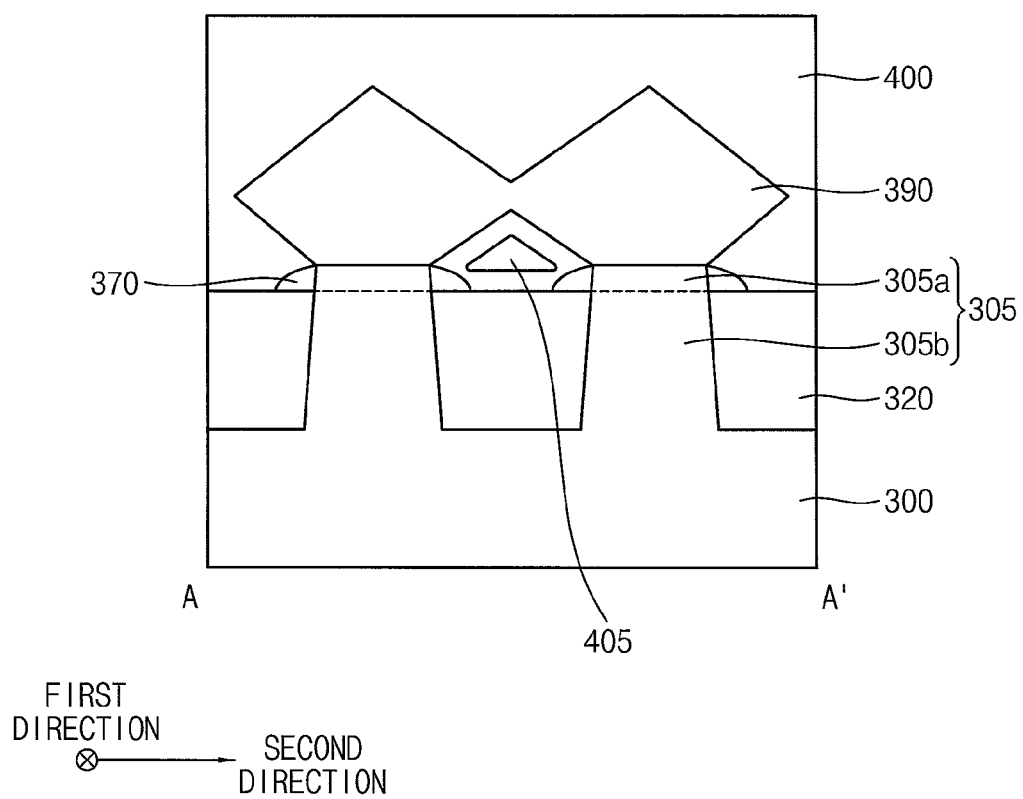
Figure 40:
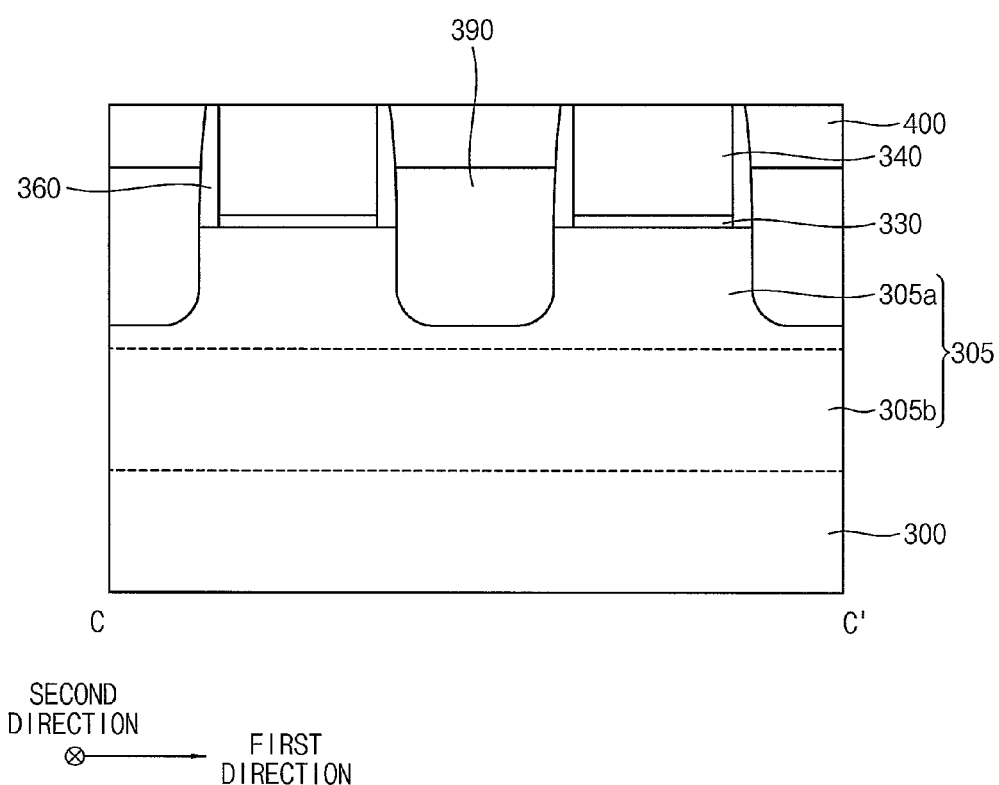

Referring to FIGS. 38 to 40, an insulation layer 400 may be formed on the active fin 305 and the isolation pattern 320 to cover the dummy gate structure, the gate spacer 360, the fin spacer 370 and the second source/drain layer 390 to a sufficient height, and may be planarized until an upper surface of the dummy gate electrode 340 of the dummy gate structure may be exposed. In the planarization process, the dummy gate mask 350 may be also removed.

A space between the merged source/drain layers 390 and the isolation pattern 320 may not be filled with the insulation layer 400, and thus an air gap 405 may be formed.

The insulation layer 400 may be formed of silicon oxide or silicon nitride, e.g., tonen silazene (TOSZ). The planarization process may be performed by a chemical mechanical polishing (CMP) process and/or an etch back process.

Figure 41:
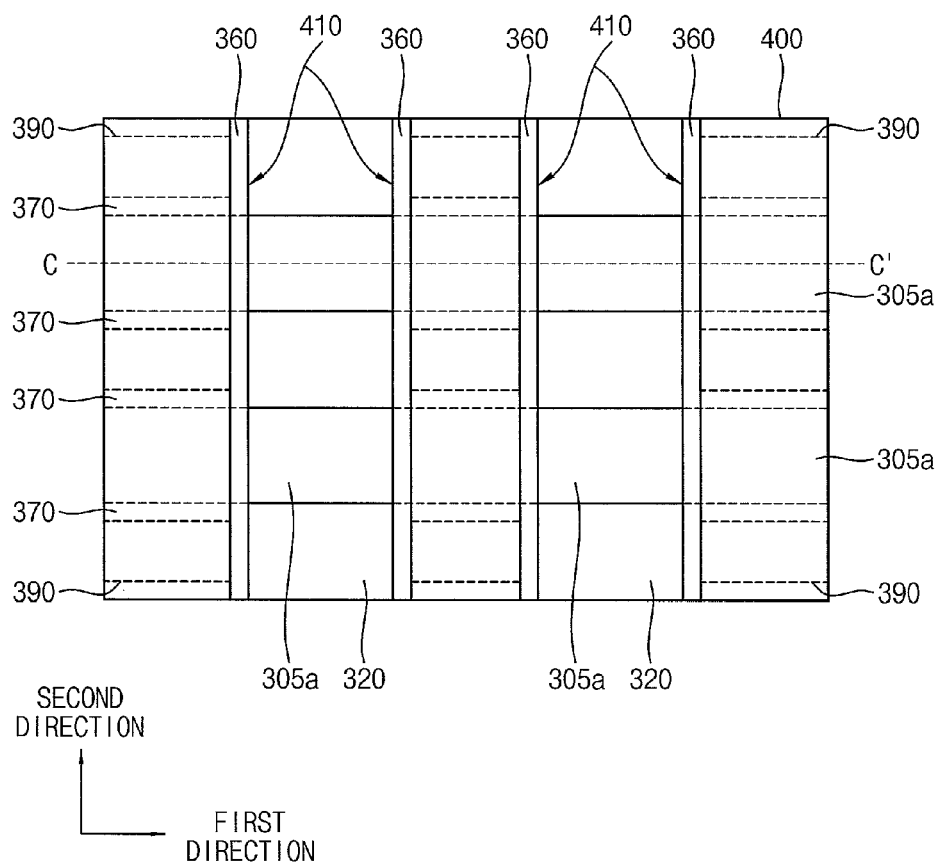
Figure 42:
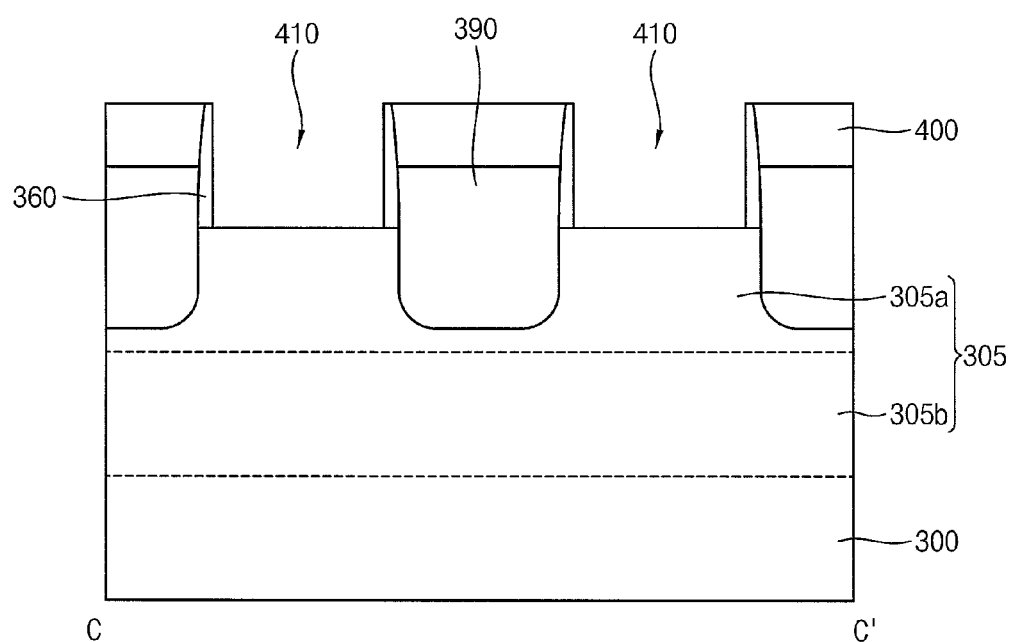

Referring to FIGS. 41 to 42, the exposed dummy gate electrode 340 and the dummy gate insulation pattern 330 thereunder may be removed to form an opening 410 exposing an inner sidewall of the gate spacer 360 and an upper surface of the active fin 305.

Figure 43:
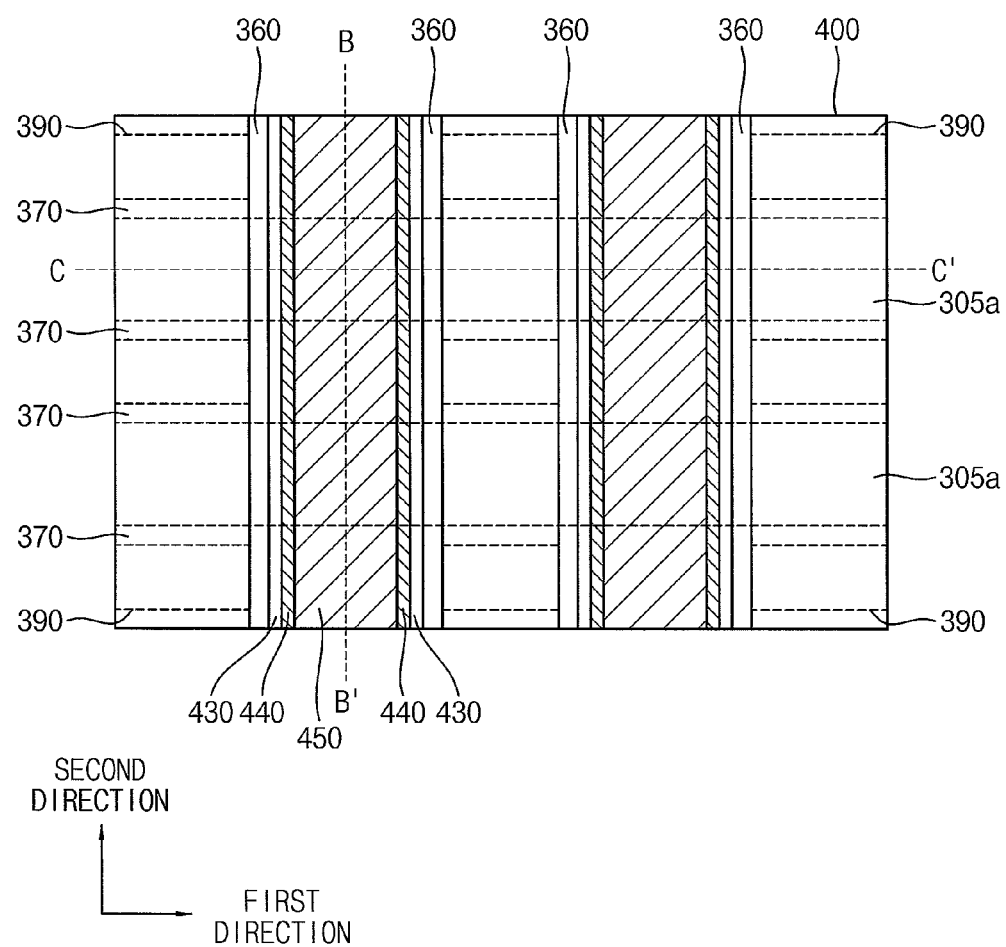
Figure 44:
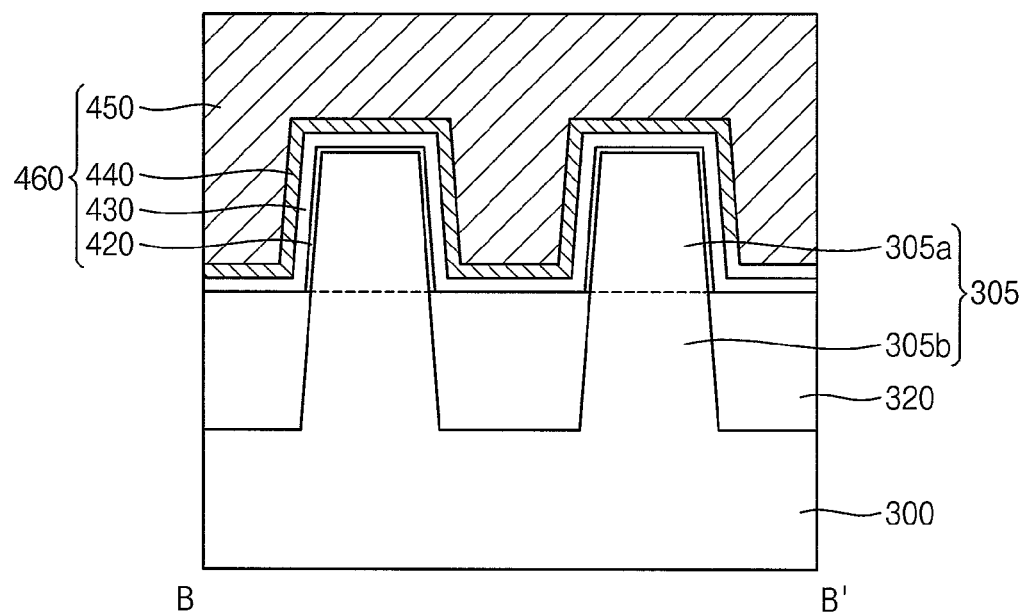
Figure 44:
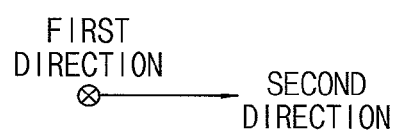
Figure 45:
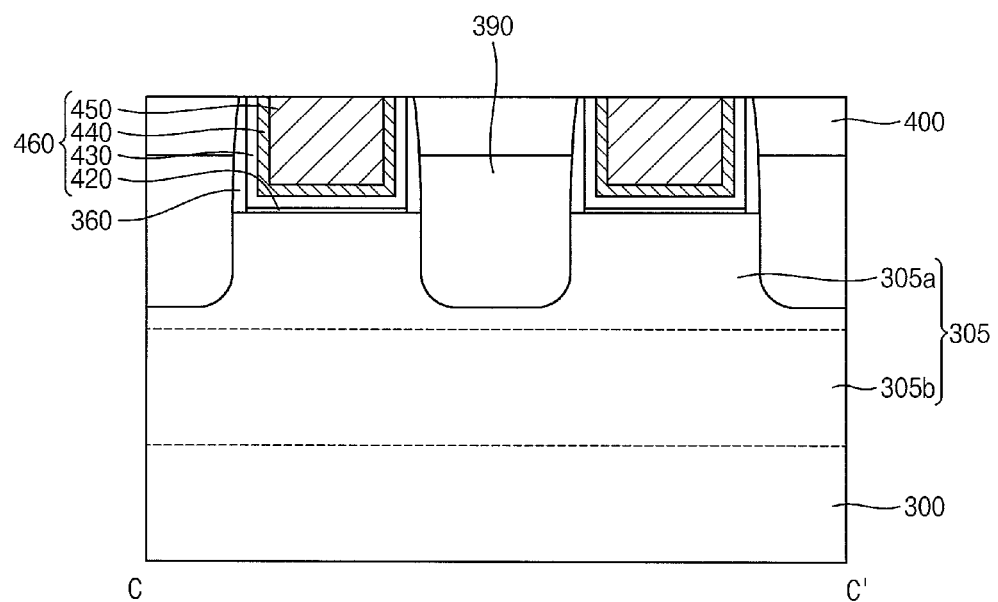

Referring to FIGS. 43 to 45, a gate structure 460 may be formed to fill the opening 410.

Particularly, after performing a thermal oxidation process on the upper surface of the active fin 305 exposed by the opening 410 to form an interface pattern 420, a gate insulation layer and a work function control layer may be sequentially formed on the interface pattern 420, the isolation pattern 320, the gate spacer 360, and the insulation layer 400, and a gate electrode layer may be formed on the work function control layer to sufficiently fill a remaining portion of the opening 410.

The gate insulation layer may be formed of a metal oxide having a high dielectric constant, e.g., hafnium oxide, tantalum oxide, zirconium oxide, or the like, by a CVD process or an ALD process. The work function control layer may be formed of a metal nitride or a metal alloy, e.g., titanium nitride, titanium aluminum, titanium aluminum nitride, tantalum nitride, tantalum aluminum nitride, etc., and the gate electrode layer may be formed of a material having a low resistance, e.g., a metal such as aluminum, copper, tantalum, etc., or a metal nitride thereof. The work function control layer and the gate electrode layer may be formed by an ALD process, a physical vapor deposition (PVD) process, or the like. In an example embodiment, a heat treatment process, e.g., a rapid thermal annealing (RTA) process, a spike rapid thermal annealing (spike RTA) process, a flash rapid thermal annealing (flash RTA) process or a laser annealing process may be further performed.

The interface pattern 420 may be formed instead of the thermal oxidation process, by a CVD process, an ALD process, or the like, similarly to the gate insulation layer or the gate electrode layer. In this case, the interface pattern 420 may be formed not only on the upper surface of the active fin 305 but also on the upper surface of the isolation pattern 320 and the inner sidewall of the gate spacer 360.

The gate electrode layer, the work function control layer, and the gate insulation layer may be planarized until an upper surface of the insulation layer 400 may be exposed to form a gate insulation pattern 430 and a work function control pattern 440 sequentially stacked on the interface pattern 420, the isolation pattern 320, and the inner sidewall of the gate spacer 360, and a gate electrode 450 filling the remaining portion of the opening 410 on the work function control pattern 440.

The interface pattern 420, the gate insulation pattern 430, the work function control pattern 440 and the gate electrode 450 sequentially stacked may form the gate structure 460, and the gate structure 460 together with the source/drain layer 390 may form a PMOS transistor or an NMOS transistor according to the conductivity type of the source/drain layer 390.

Figure 46:
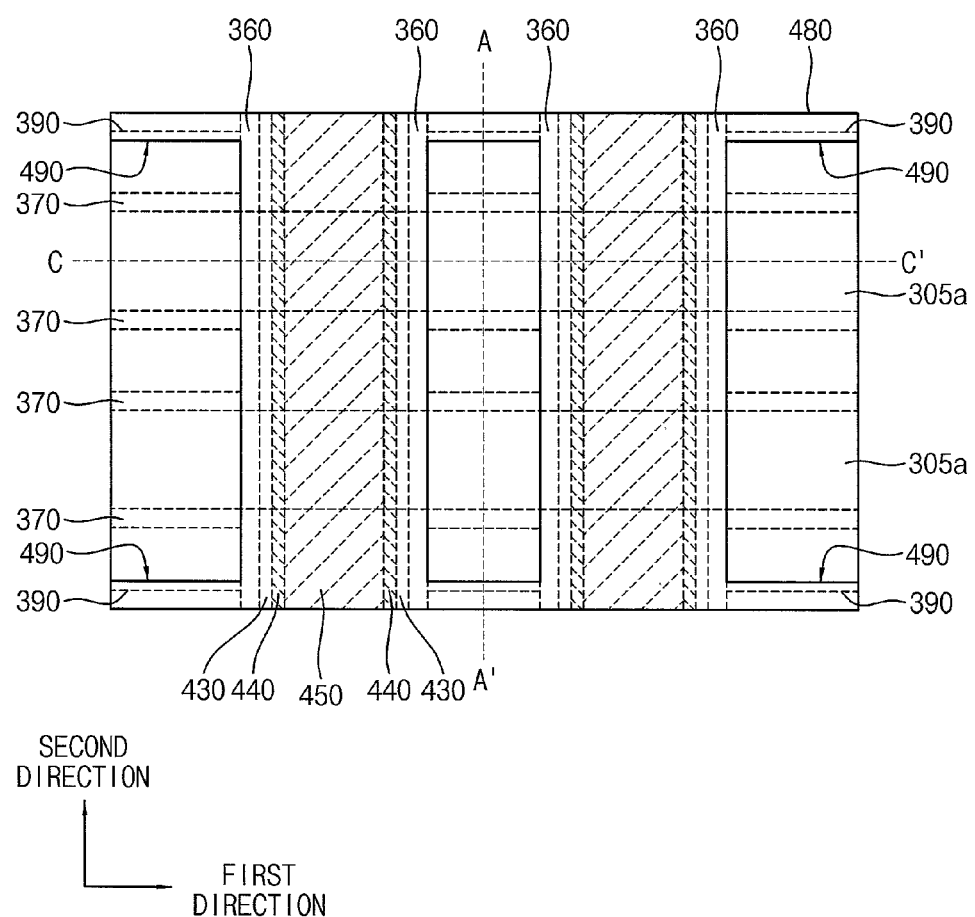
Figure 47:
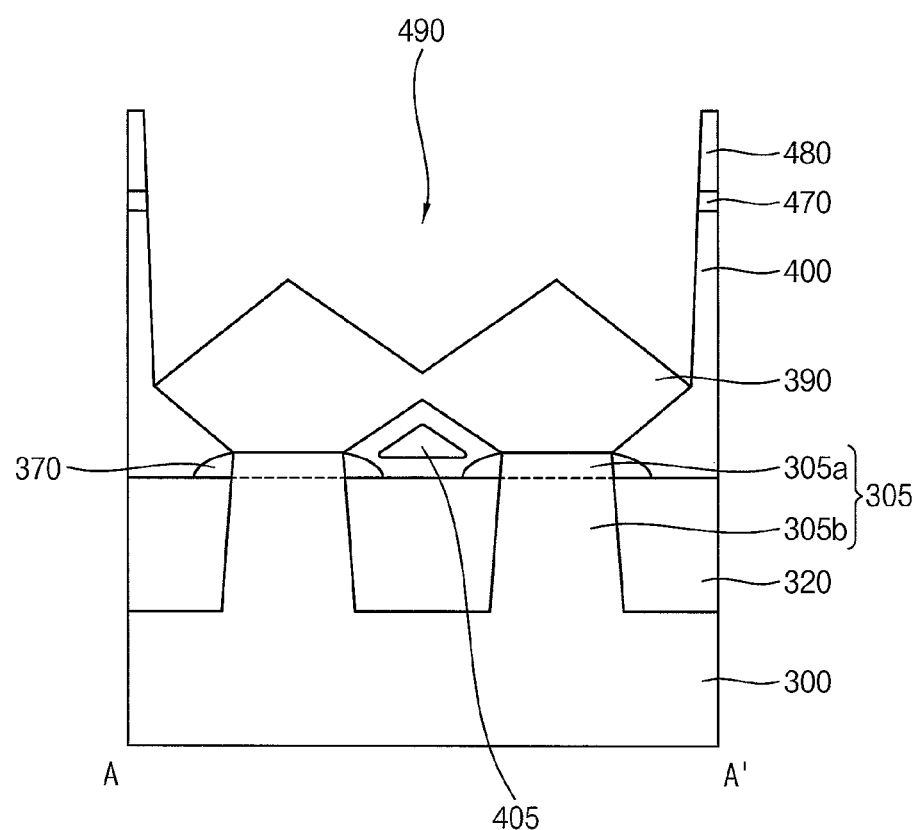
Figure 48:
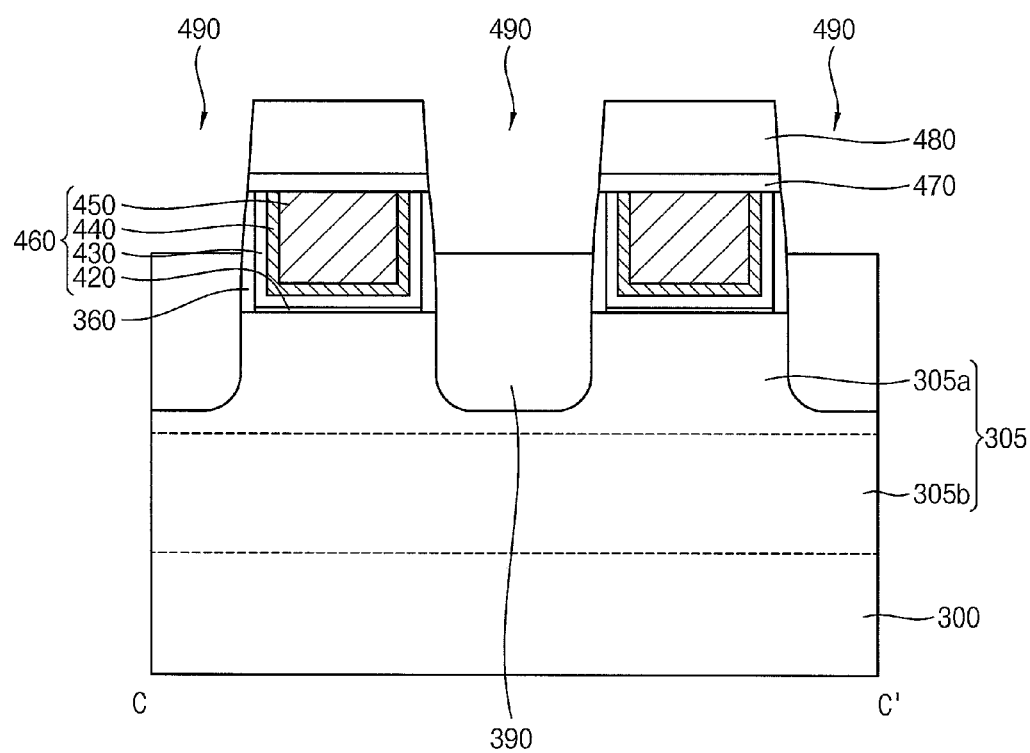
Figure 49:
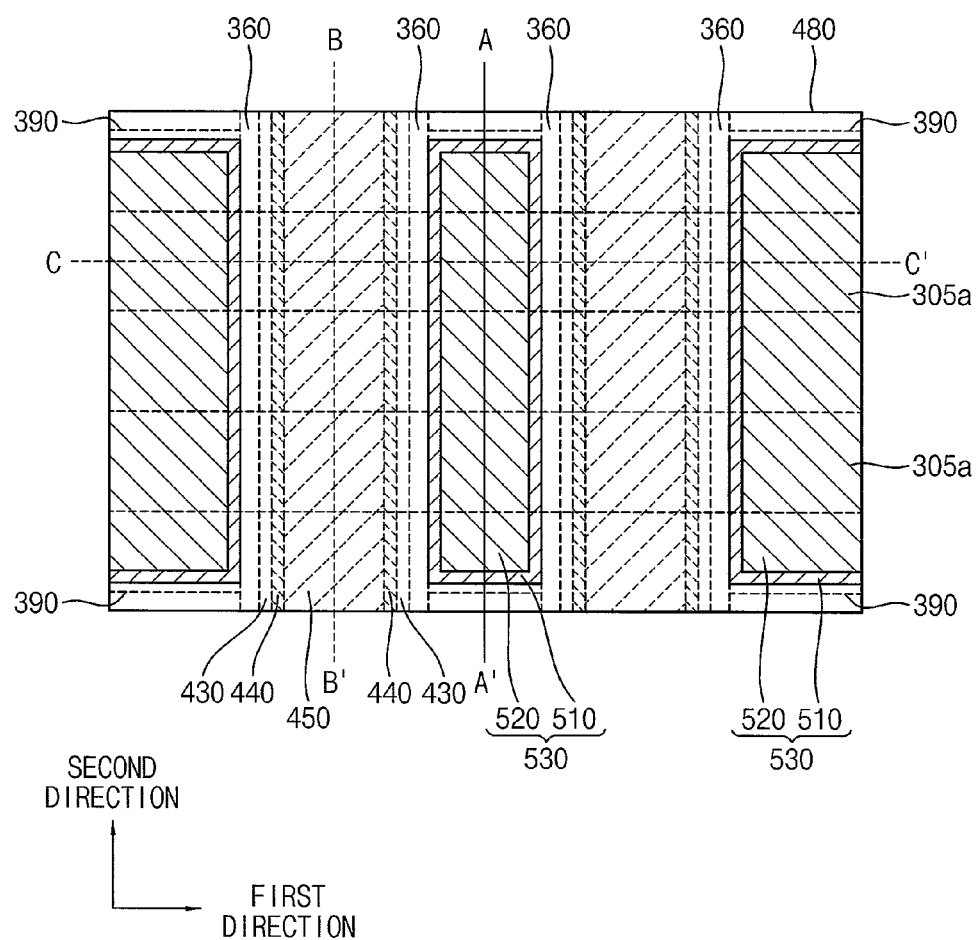
Figure 50:
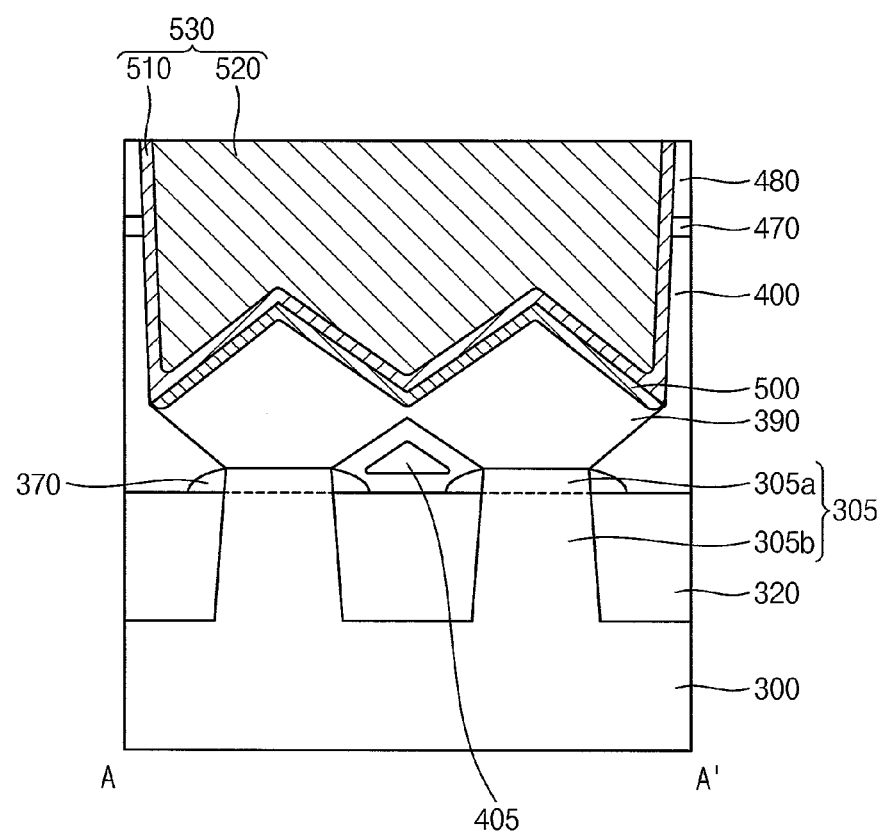
Figure 51:
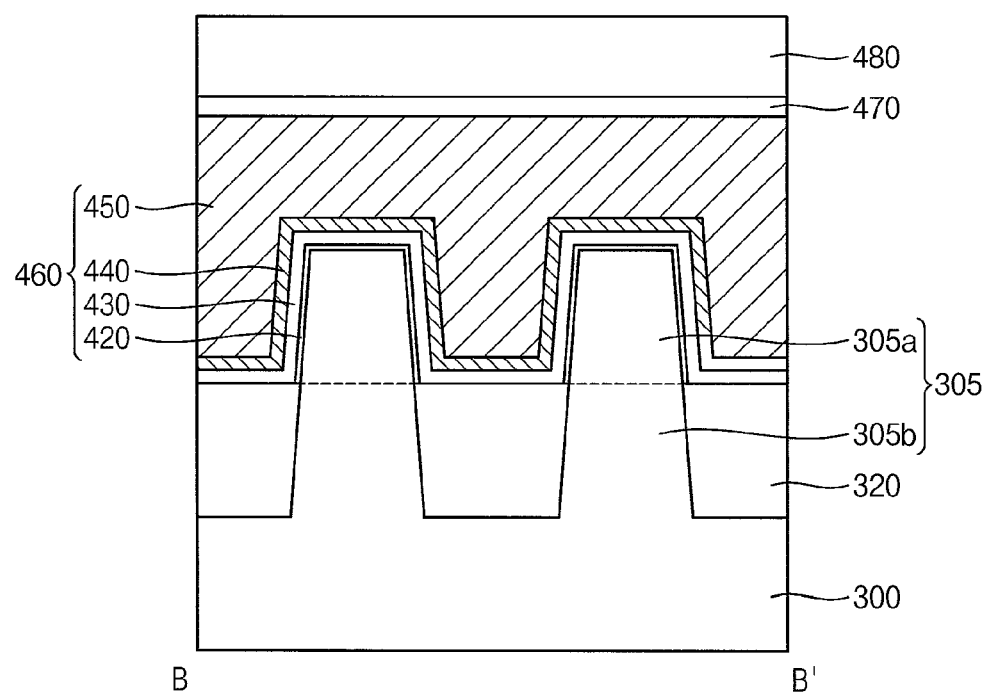
Figure 51:
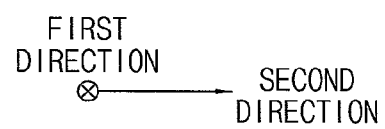
Figure 52:
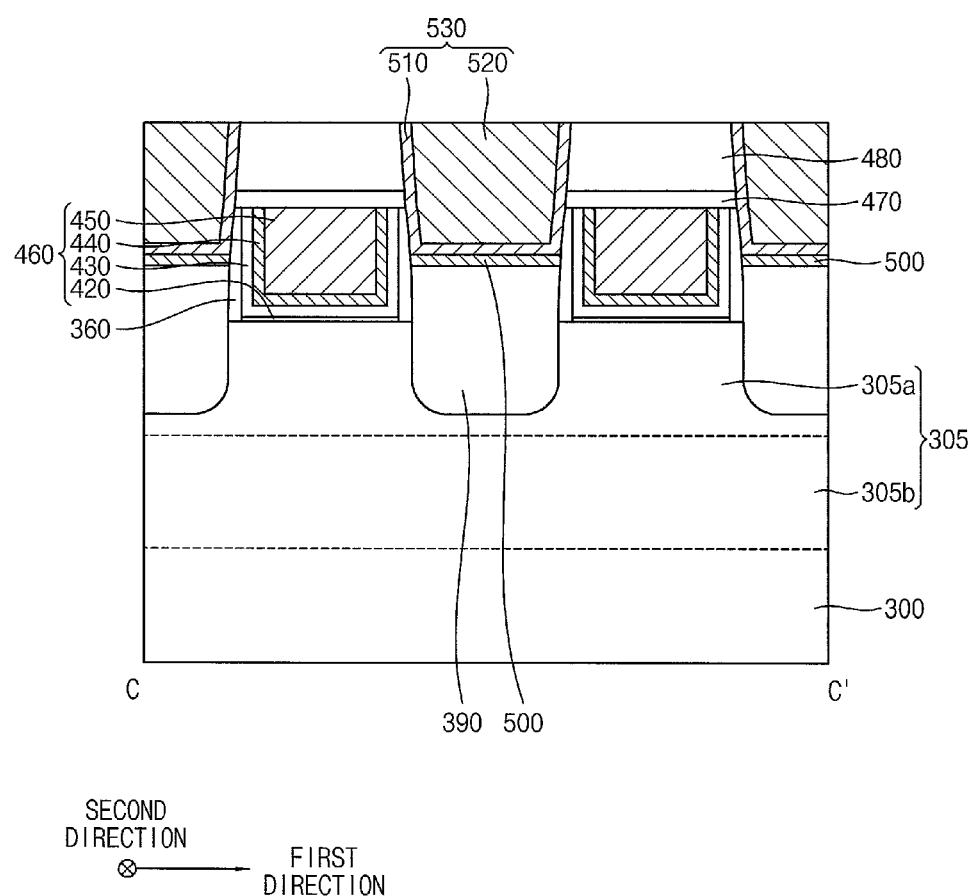
Figure 53:
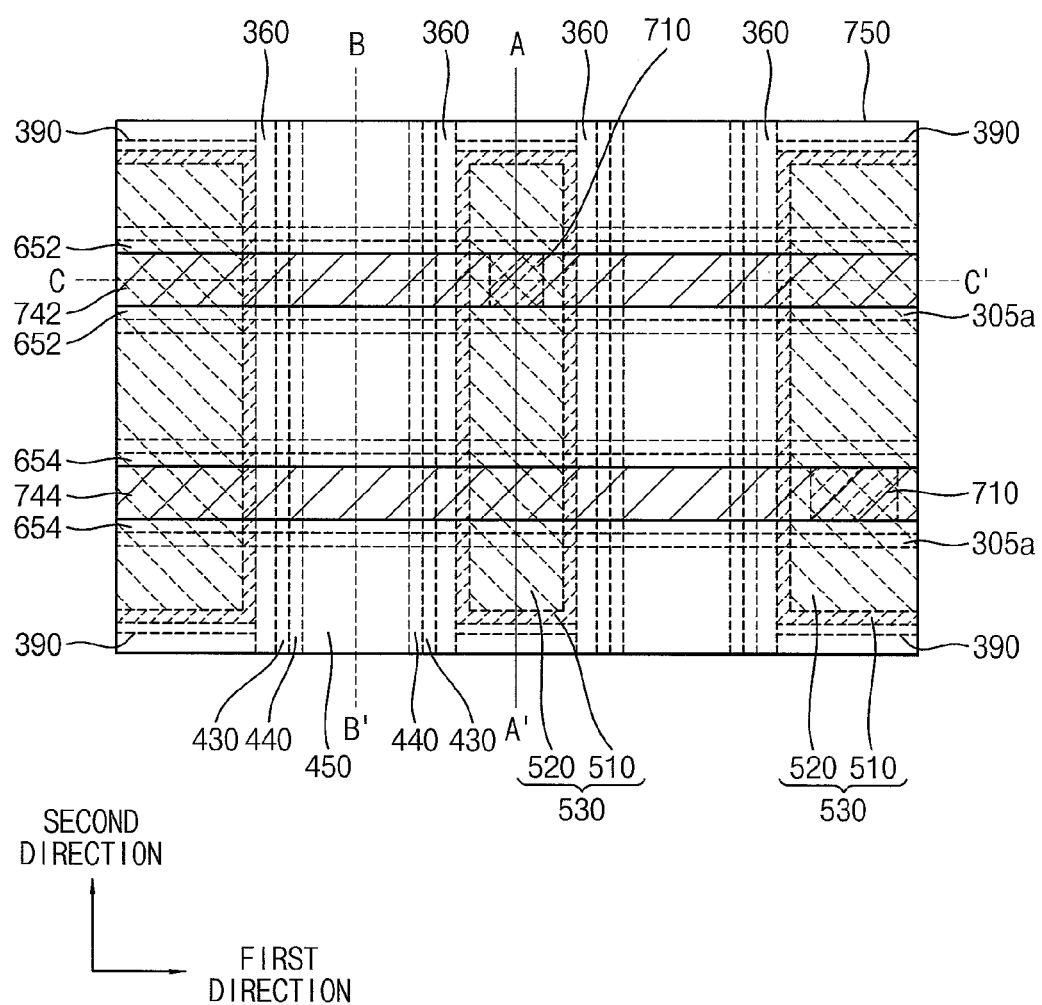
Figure 54:
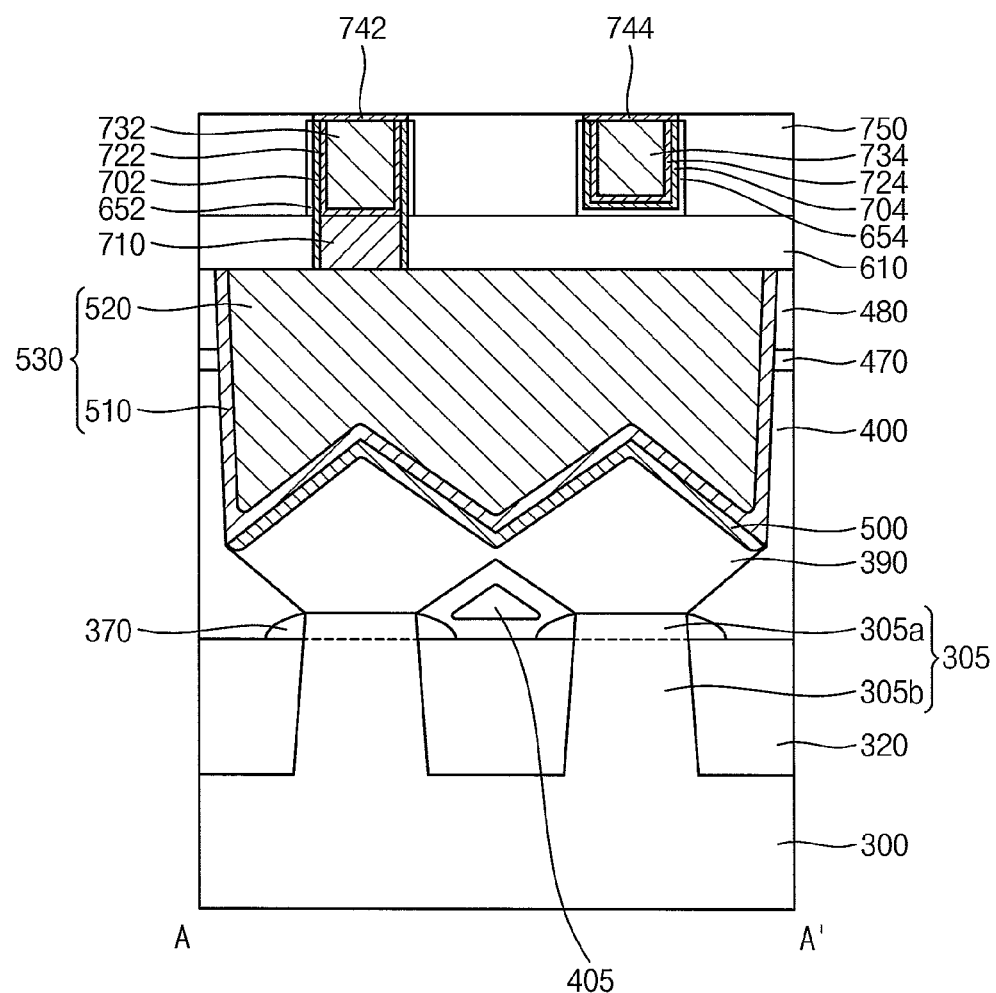
Figure 55:
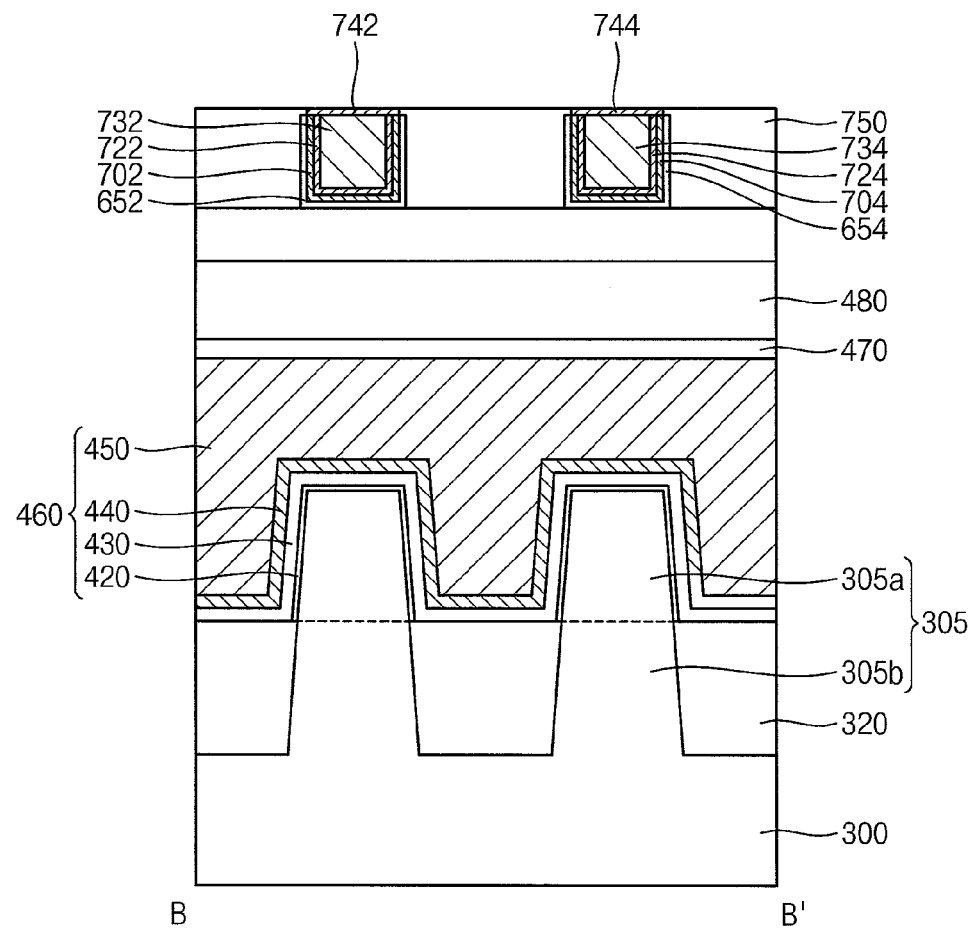
Figure 56:
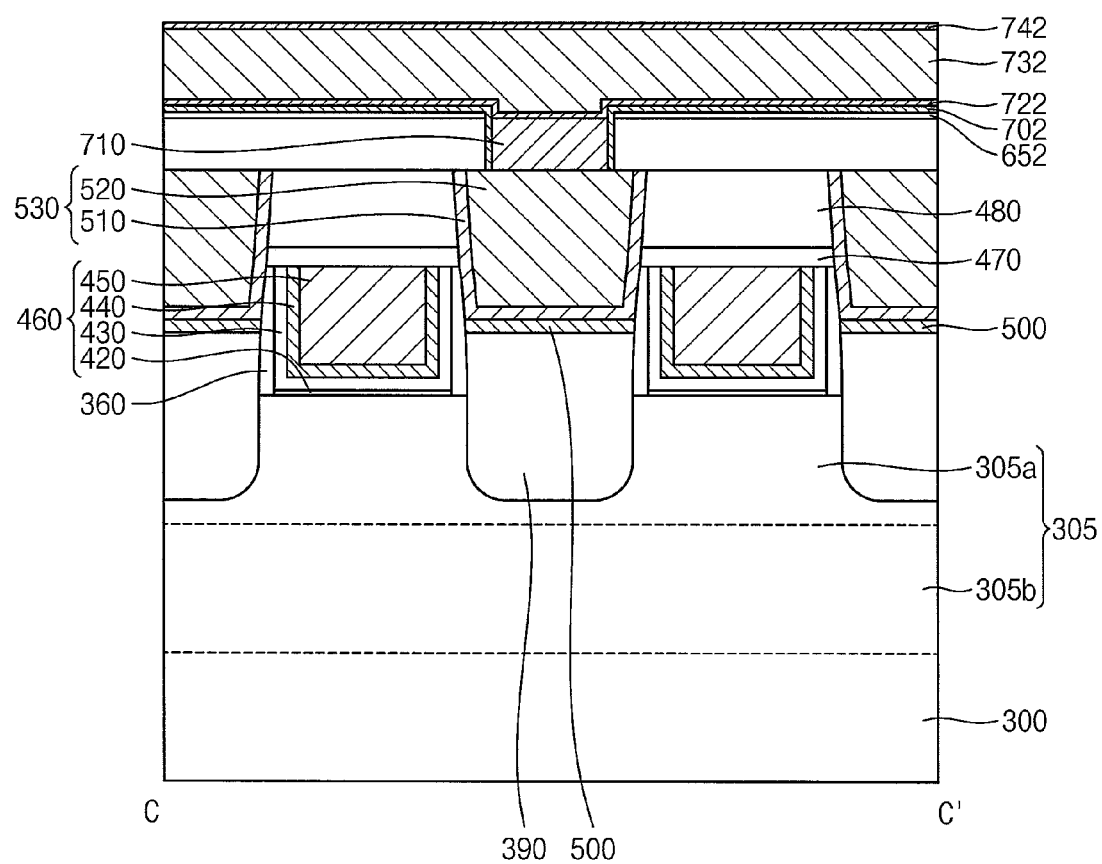
Figure 56:

Referring to FIGS. 46 to 48, a capping layer 470 and a lower insulating interlayer 480 330 may be sequentially formed on the insulation layer 400, the gate structure 460, and the gate spacer 360, and a contact hole 490 may be formed through the insulation layer 400, the capping layer 470 and the lower insulating interlayer 480 to expose an upper surface of the source/drain layer 390.

The capping layer 470 may be formed of a nitride, e.g., silicon nitride, and the lower insulating interlayer 480 may be formed of silicon oxide, e.g., tetra ethyl ortho silicate (TEOS).

In example embodiments, the contact hole 490 may be formed to be self-aligned with the gate spacer 360, and thus may expose an entire portion of the upper surface of the source/drain layer 390 in the first direction. However, the inventive concepts may not be limited thereto, and the contact hole 490 may not be self-aligned with the gate spacer 360, but may expose only a portion of the upper surface of the source/drain layer 390 in the first direction.

Referring to FIGS. 49 to 52, after forming a first metal layer on the exposed upper surface of the source/drain layer 390, a sidewall of the contact hole 490, and the upper surface of the lower insulating interlayer 480, a heat treatment process may be performed thereon to form a metal silicide pattern 500 on the source/drain layer 390. An unreacted portion of the first metal layer may be removed.

The first metal layer may be formed of a metal, e.g., titanium, cobalt, nickel, etc.

A barrier layer may be formed on the metal silicide pattern 500, the sidewall of the contact hole 490 and the upper surface of the lower insulating interlayer 480, a second metal layer may be formed on the barrier layer to fill the contact hole 490, and the second metal layer and the barrier layer may be planarized until the upper surface of the lower insulating interlayer 480 may be exposed.

Thus, a contact plug 530 may be formed on the metal silicide pattern 500 to fill the contact hole 490.

The barrier layer may be formed of a metal nitride, e.g., titanium nitride, tantalum nitride, tungsten nitride, etc., and the second metal layer may be formed of a metal, e.g., tungsten, copper, etc.

The contact plug 530 may include a metal pattern 520 and a barrier pattern 510 covering a lower surface and a sidewall thereof.

Referring to FIGS. 53 to 56, processes substantially the same as or similar to those illustrated with reference to FIGS. 2 to 13 and FIG. 1 may be performed to complete the semiconductor device.

That is, first and second insulating interlayers 610 and 750 may be formed on the lower insulating interlayer 480 and the contact plug 530, and a via 710 extending through the first insulating interlayer 610 and first and second wirings 732 and 734 extending through the second insulating interlayer 750 may be formed.

Lower surfaces and sidewalls of the first and second wirings 732 and 734 may be covered by first and second conductive liners 722 and 724, respectively, and a sidewall of a first wiring structure including the via 710, the first conductive liner 722 and the first wiring 732 may be covered by a first SFB pattern 702, and the second conductive liner 724 may be covered by a second SFB pattern 704. A portion of the first SFB pattern 702 on the sidewall of the first wiring 732 may be covered by a first insulating liner 652, and the second SFB pattern 704 covering the lower surface and the sidewall of the second wiring 734 may be covered by a second insulating liner 654.

In the figures, each of the first and second wirings 732 and 734 extends in the first direction and only one via 710 is formed on each of the first and second wirings 732 and 734, however, the inventive concepts may not be limited thereto. The numbers and shapes of the first and second wirings 732 and 734, and the number and position of the via 710 may be varied.

The above method of manufacturing the semiconductor device may be applied to methods of manufacturing various types of memory devices including wiring structures. For example, the method may be applied to methods of manufacturing logic devices such as central processing units (CPUs), main processing units (MPUs), or application processors (APs), or the like. Additionally, the method may be applied to methods of manufacturing volatile memory devices such as DRAM devices or SRAM devices, or non-volatile memory devices such as flash memory devices, PRAM devices, MRAM devices, RRAM devices, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:
   sequentially forming a first insulating interlayer and a sacrificial layer on a substrate;
   partially removing the sacrificial layer to form a first opening exposing an upper surface of the first insulating interlayer;
   conformally forming an insulating liner on the exposed upper surface of the first insulating interlayer and a sidewall of the first opening, the insulating liner including silicon oxide;
   removing at least a portion of the insulating liner on the upper surface of the first insulating interlayer and a portion of the first insulating interlayer thereunder to form a second opening connected to the first opening;
   forming a self-forming barrier (SFB) pattern on a sidewall of the second opening and the insulating liner;
   forming a wiring structure to fill the first and second openings, the forming the wiring structure including forming a via to fill the second opening and forming a wiring on the via to fill the first opening; and
   after removing the sacrificial layer, forming a second insulating interlayer.

2. The method of claim 1, wherein the forming a SFB pattern includes:
   forming a metal layer or a metal oxide layer, the metal layer or the metal oxide layer including manganese, aluminum, vanadium or chrome, and reacting the metal layer or the metal oxide layer with the insulating liner and a portion of the first insulating interlayer exposed by a sidewall of the second opening.

3. The method of claim 1, wherein the forming a SFB pattern includes forming the SFB pattern including manganese silicon oxide, aluminum silicon oxide, vanadium silicon oxide or chrome silicon oxide.

4. The method of claim 1, wherein the sequentially forming forms the sacrificial layer including an amorphous carbon layer (ACL).

5. The method of claim 1, wherein the forming a second insulating interlayer includes:
removing the sacrificial layer to expose the insulating liner; and
forming the second insulating interlayer to cover the exposed insulating liner.

6. The method of claim 1, wherein
the forming a via includes forming the via including cobalt or ruthenium, and
the forming a wiring includes forming the wiring including copper or aluminum.

7. The method of claim 1, further comprising:
forming a conductive liner on an upper surface of the via and a sidewall of the first opening after the forming a via.

8. The method of claim 7, wherein the via and the conductive liner include cobalt or ruthenium.

9. The method of claim 1, further comprising:
forming a capping pattern on the wiring after the forming a wiring.

10. The method of claim 1, wherein the forming a via forms the via having a sidewall substantially perpendicular to an upper surface of the substrate.

11. The method of claim 1, wherein the removing includes:
sequentially forming a filling layer and a mask layer on the insulating liner to fill the first opening;
patterning the mask layer to form an etching mask;
partially etching the filling layer, the insulating liner and the first insulating interlayer using the etching mask; and
removing the etching mask and the filling layer.

12. The method of claim 1, wherein the upper surface of the first insulating interlayer extends in a first direction, and the sidewall of the first opening extends in a second direction different from the first direction.

13. The method of claim 1, wherein the first and second insulating interlayers include a dielectric material having a dielectric constant lower than a dielectric constant of silicon dioxide.

14. A method of manufacturing a semiconductor device, the method comprising:
sequentially forming a first dielectric layer and a sacrificial layer on a substrate, the first dielectric layer including silicon oxide and the sacrificial layer including amorphous carbon;
partially removing the sacrificial layer to form a trench exposing an upper surface of the first dielectric layer;
conformally forming an insulating liner on a sidewall of the trench, the insulating liner including silicon;
partially removing the first dielectric layer to form a via hole under the trench;
forming a self-forming barrier (SFB) pattern on a sidewall of the via hole and the insulating liner, the SFB pattern including a metal silicon oxide;
forming a wiring structure on the SFB pattern to fill the via hole and the trench; and
replacing the sacrificial layer with a second dielectric layer.

15. The method of claim 14, wherein the forming a wiring structure includes:
forming a via to fill the via hole; and
forming a wiring to fill the trench.

16. A method comprising:
sequentially forming a first dielectric layer and a sacrificial layer on a substrate, the sacrificial layer not including silicon oxide;
partially removing the sacrificial layer to form a trench exposing the first dielectric layer;
conformally forming a silicon oxide layer on a sidewall of the trench;
removing at least a portion of the silicon oxide layer to form a via hole connected to the trench;
forming a metal layer on a sidewall of the via hole and the silicon oxide layer;
reacting the metal layer with the exposed first dielectric layer and the silicon oxide layer to form a metal silicon oxide pattern; and
forming a wiring structure on the metal silicon oxide pattern.

17. The method of claim 16, wherein the metal silicon oxide pattern includes manganese silicon oxide, aluminum silicon oxide, vanadium silicon oxide or chrome silicon oxide.

18. The method of claim 16, wherein the sequentially forming forms the sacrificial layer including an amorphous carbon layer (ACL).

19. The method of claim 16, further comprising:
removing the sacrificial layer to expose the silicon oxide layer; and
forming a second dielectric layer to cover the exposed silicon oxide layer.

20. The method of claim 19, wherein the first and second dielectric layers include a dielectric material having a dielectric constant lower than a dielectric constant of silicon dioxide.

* * * * *